United States Patent
Kai et al.

(10) Patent No.: US 9,299,947 B2
(45) Date of Patent: Mar. 29, 2016

(54) ORGANIC ELECTROLUMINESCENT DEVICE HAVING AN ELECTRON- AND /OR EXCITON-BLOCKING LAYER COMPRISING AN INDOLOCARBAZOLE COMPOUND

(75) Inventors: Takahiro Kai, Kitakyushu (JP);
Toshihiro Yamamoto, Kitakyushu (JP);
Masaki Komori, Kitakyushu (JP);
Kazuaki Yoshimura, Kitakyushu (JP);
Taishi Tsuji, Tsurugashima (JP);
Yasuhiro Takahashi, Tsurugashima (JP)

(73) Assignees: NIPPON STEEL & SUMIKIN CHEMICAL CO., LTD., Tokyo (JP);
PIONEER CORPORATION, Kanagawa (JP)

(*) Notice: Subject to any disclaimer, the term of this patent is extended or adjusted under 35 U.S.C. 154(b) by 319 days.

(21) Appl. No.: 13/257,163

(22) PCT Filed: Mar. 25, 2010

(86) PCT No.: PCT/JP2010/055240
§ 371 (c)(1),
(2), (4) Date: Sep. 16, 2011

(87) PCT Pub. No.: WO2010/113761
PCT Pub. Date: Oct. 7, 2010

(65) Prior Publication Data
US 2012/0007070 A1  Jan. 12, 2012

(30) Foreign Application Priority Data
Mar. 31, 2009 (JP) .................... 2009-085657

(51) Int. Cl.
H01L 51/54 (2006.01)
C09K 11/06 (2006.01)
H01L 51/50 (2006.01)
H01L 51/00 (2006.01)
H05B 33/22 (2006.01)

(52) U.S. Cl.
CPC .......... *H01L 51/5096* (2013.01); *C09K 11/06* (2013.01); *H01L 51/0072* (2013.01); *H05B 33/22* (2013.01); *C09K 2211/1029* (2013.01); *H01L 51/0081* (2013.01); *H01L 51/0085* (2013.01); *H01L 51/5016* (2013.01); *H01L 2251/552* (2013.01)

(58) Field of Classification Search
None
See application file for complete search history.

(56) References Cited

U.S. PATENT DOCUMENTS

| 5,942,340 A * | 8/1999 | Hu et al. .................. 428/690 |
| 2002/0022149 A1* | 2/2002 | Watanabe et al. ........... 428/690 |
| 2005/0006642 A1* | 1/2005 | Tung et al. .................. 257/40 |
| 2008/0220285 A1* | 9/2008 | Vestweber et al. .......... 428/690 |

FOREIGN PATENT DOCUMENTS

| EP | 1956022 A1 * | 8/2008 |
| JP | 11-162650 A | 6/1999 |
| JP | 11-176578 A | 7/1999 |
| JP | 2003-229275 A | 8/2003 |
| JP | 2006-32599 A | 2/2006 |
| WO | WO-2007/063754 A1 | 6/2007 |
| WO | WO-2008/056746 A1 | 5/2008 |
| WO | WO 2008/146839 A1 | 12/2008 |
| WO | WO-2008/149691 A1 | 12/2008 |

OTHER PUBLICATIONS

Belletete et al. "Optical and Photophysical Properties of Indolocarbazole Derivatives" J. Phys. Chem. A 2006, 110, 13696-13704. Date of online publication: Dec. 2, 2006.*
International Search Report for the Application No. PCT/JP2010/055240 mailed Jun. 29, 2010.
Adamovich, Vadim et al., "High Efficiency Single Dopant White Electrophosphorescent Light Emitting Diodes", New Journal of Chemistry, 2002, vol. 26, pp. 1171-1178.
Holmes, R. J., et al., "Efficient, Deep-Blue Organic Electrophosphorescence by Guest Charge Trapping", Applied Physics Letter, 2003, vol. 83, No. 18, pp. 3818-3820.
Chopra, Neetu at al., "High Efficiency Blue Phosphorescent Organic Light-Emitting Device", Applied Physics Letters, 2008, vol. 93, pp. 143307-1 to 143307-3.

* cited by examiner

*Primary Examiner* — Andrew K Bohaty
(74) *Attorney, Agent, or Firm* — Cheng Law Group, PLLC

(57) ABSTRACT

Provided is an organic electroluminescent device (organic EL device), which has improved luminous efficiency, shows sufficiently ensured driving stability, and has a simple construction. The organic electroluminescent device includes an anode, a cathode, and organic layers including a hole-transporting layer and a light-emitting layer, the organic layers being interposed between the anode and the cathode, in which the light-emitting layer contains a phosphorescent light-emitting material and the hole-transporting layer and the light-emitting layer have an electron- and/or exciton-blocking layer therebetween, the electron- and/or exciton-blocking layer being adjacent to the light-emitting layer and containing an indolocarbazole compound represented by the general formula (2). In the formula, a ring B represents a heterocycle represented by the formula (1c) to be fused with adjacent rings, Z represents an n-valent aromatic hydrocarbon group or an aromatic heterocyclic group, and n represents 1 or 2.

16 Claims, 2 Drawing Sheets

ORGANIC ELECTROLUMINESCENT DEVICE HAVING AN ELECTRON- AND /OR EXCITON-BLOCKING LAYER COMPRISING AN INDOLOCARBAZOLE COMPOUND

TECHNICAL FIELD

The present invention relates to an organic electroluminescent device containing an indolocarbazole compound, and more particularly, to a thin-film-type device which emits light when an electric field is applied to a light-emitting layer formed of an organic compound.

BACKGROUND ART

In general, an organic electroluminescent device (hereinafter, referred to as organic EL device) is constructed of a light-emitting layer and a pair of counter electrodes interposing the light-emitting layer therebetween in its simplest structure. That is, the organic EL device utilizes the following phenomenon. When an electric field is applied between both electrodes, electrons are injected from a cathode and holes are injected from an anode. Those electrons and holes recombine with each other in the light-emitting layer to emit light.

An organic EL device using an organic thin film has started to be developed in recent years. In particular, in order to enhance luminous efficiency, there has been developed a device which is optimized for the kind of electrodes for the purpose of improving the efficiency of injection of carriers from the electrodes, and includes a hole-transporting layer formed of an aromatic diamine and a light-emitting layer formed of an 8-hydroxyquinoline aluminum complex (Alq3) as thin films between the electrodes, leading to a great improvement in luminous efficiency as compared to a conventional device using a single crystal of anthracene or the like. Thus, studies have been made on the practical application of the device to a high-performance flat panel having features such as self-light emission and rapid response.

Further, studies have also been made on using phosphorescent light rather than fluorescent light as an attempt to raise the luminous efficiency of the device. Numerous devices such as the above-mentioned device including a hole-transporting layer formed of an aromatic diamine and a light-emitting layer formed of Alq3 utilize fluorescent light emission. However, by using phosphorescent light emission, that is, by utilizing light emission from a triplet excited state, the efficiency is expected to be improved by about three to four times as compared to a conventional device using fluorescent light (singlet). For this purpose, studies have been made on using a coumarin derivative and a benzophenone derivative in a light-emitting layer, but extremely low luminance has only been provided. Further, studies have been made on using a europium complex as an attempt to utilize a triplet state, but highly efficient light emission has not been attained. In recent years, as described in Patent Literature 1, many pieces of research centered on an organic metal complex such as an iridium complex have been made for the purpose of attaining the high efficiency and long life of light emission.

CITATION LIST

Patent Literature

[PTL 1] JP 2003-515897 A
[PTL 2] JP 11-162650 A
[PTL 3] JP 11-176578 A

Non Patent Literature

[NPL 1] New Journal of Chemistry 2002, 26, 1171
[NPL 2] APPLIED PHYSICS LETTERS 2003, 83, 3818
[NPL 3] APPLIED PHYSICS LETTERS 2008, 93, 143307

Meanwhile, in an organic EL device, holes and electrons are injected from both electrodes to a light-emitting layer in a well-balanced manner, and the injected holes and electrons recombine with each other efficiently in the light-emitting layer, thereby providing satisfactory luminous efficiency. In other words, when a balance between both charges to be injected to the light-emitting layer and a balance between both charges to be transported in the light-emitting layer are lost, the leakage of the charges to a transporting layer occurs, resulting in a reduction in probability of recombination in the light-emitting layer. In addition, in a state in which both charges lose their balance, a recombination region in the light-emitting layer is limited to a narrow region in the vicinity of the boundary with the transporting layer. In such case, the leakage of excitons from the light-emitting layer to the transporting layer occurs, leading to a reduction in luminous efficiency. In particular, the leakage of electrons and excitons to a hole-transporting layer causes a reduction in luminous efficiency and simultaneously a reduction in life of a device due to the deterioration of a hole-transporting material. Hence, this is an extremely critical problem.

In order to solve the above-mentioned problem, Non Patent Literature 1 proposes using the following compound to provide an electron- and/or exciton-blocking layer at the boundary on the anode side of the light-emitting layer, which is effective for improving the efficiency.

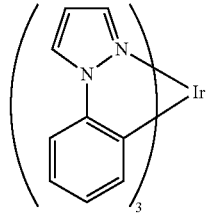

In addition, Non Patent Literatures 2 and 3 disclose examples using 1,3-dicarbazolylbenzene (mCP) in an electron-blocking layer and an exciton-blocking layer.

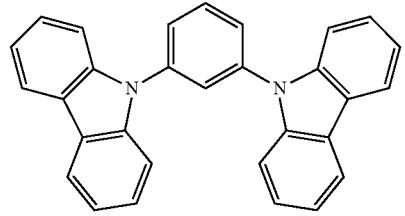 [SMILES: c1cc(-n2c3ccccc3c3ccccc32)cc(-n2c3ccccc3c3ccccc32)c1]

However, in each of those devices, there is a problem in that no practical light emission characteristic or operation life is exerted because the driving voltage is high and the durability of the compound used is insufficient.

That is, as a method of achieving an organic EL device exhibiting satisfactory light emission and life characteristics, there is known a technique for inserting an organic layer between a hole-transporting layer and a light-emitting layer, thereby blocking electrons and/or excitons from leaking to the hole-transporting layer. At present, however, there is known no material which plays this function at a practical level. The organic layer to be inserted between the hole-transporting layer and the light-emitting layer blocks electrons and/or excitons from leaking to the hole-transporting layer, and hence is also referred to as electron-blocking layer or exciton-blocking layer. The electron- and/or exciton-blocking layer as used herein refers to this organic layer. Hereinafter, the electron- and/or exciton-blocking layer is also referred to as EB layer.

Meanwhile, Patent Literature 2 and Patent Literature 3 disclose the following indolocarbazole compounds. However, those patent literatures disclose that the indolocarbazole compounds are incorporated as charge-transporting components, recommend that the compounds be used as materials for a hole-injecting layer or a hole-transporting layer, but do not teach that the compounds are used as materials for an EB layer between a light-emitting layer and a hole-transporting layer, the EB layer being adjacent to the light-emitting layer.

compound having a specific structure in an EB layer of an organic EL device. Thus, the present invention has been completed.

That is, the present invention relates to an organic electroluminescent device, including: an anode; a cathode; and organic layers including at least: a hole-transporting layer; and a light-emitting layer, the organic layers being interposed between the anode and the cathode, in which: the light-emitting layer includes a phosphorescent light-emitting material; and the hole-transporting layer and the light-emitting layer have an electron- and/or exciton-blocking layer (EB layer) therebetween, the electron- and/or exciton-blocking layer

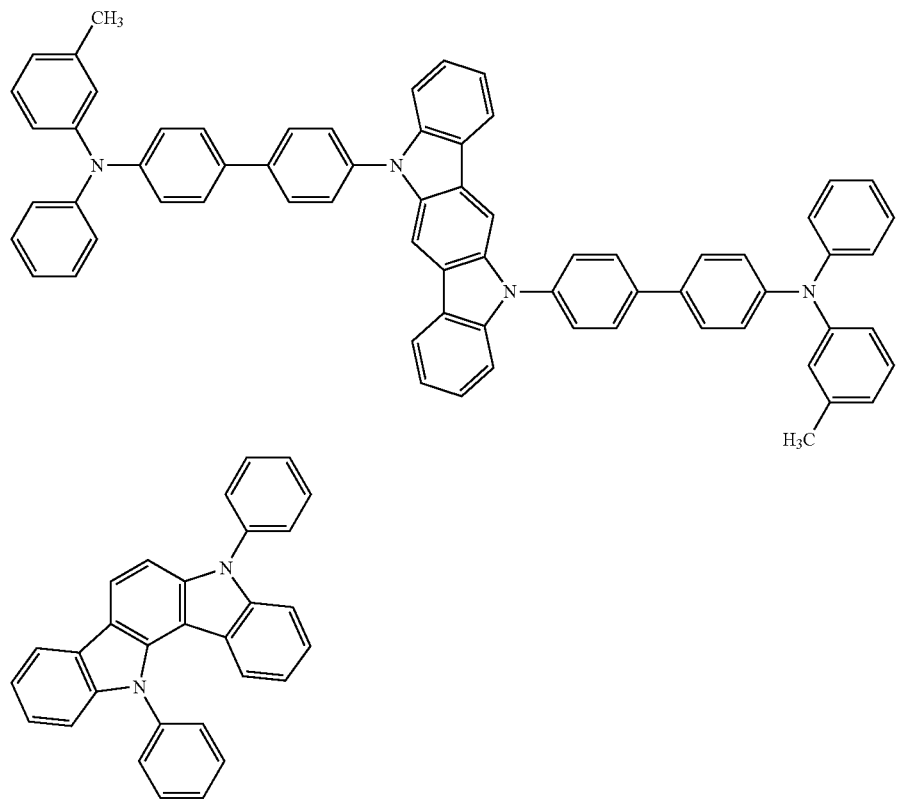

Further, the patent literatures disclose characteristics of organic EL devices using those indolocarbazole compounds in the hole-transporting layer. However, there remains a problem in that the driving voltage is high and the life characteristic is poor, and it is therefore hard to say that the devices are sufficiently satisfactory at a practical level in both of the light emission and life characteristics.

SUMMARY OF INVENTION

In order to apply an organic EL device to a display device such as a flat panel display, it is necessary to improve the luminous efficiency of a device and simultaneously ensure the driving stability of the device sufficiently. In view of the above-mentioned current circumstances, an object of the present invention is to provide an organic EL device, which has high efficiency and high driving stability and is thus practically useful, and a compound suitable therefor.

The inventors of the present invention have made intensive studies. As a result, the inventors have found that the above-mentioned problems are solved by using an indolocarbazole being adjacent to the light-emitting layer and containing an indolocarbazole compound represented by the following general formula (1):

(1)

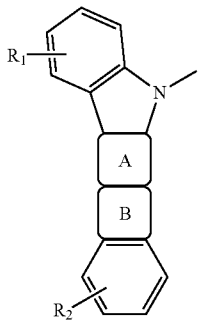

(1a)

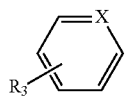

(1b)

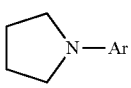

(1c)

in the general formula (1): Z represents an n-valent aromatic hydrocarbon group having 6 to 50 carbon atoms or an aromatic heterocyclic group having 3 to 50 carbon atoms; Y represents a group represented by the formula (1a); and n represents an integer of 1 to 6, provided that when n represents 2 or more, Y's may be identical to or different from each other;

in the formula (1a): a ring A represents an aromatic ring represented by the formula (1b) to be fused with adjacent rings; a ring B represents a heterocycle represented by the formula (1c) to be fused with adjacent rings; and $R_1$ and $R_2$ each independently represent a hydrogen atom, an aliphatic hydrocarbon group having 1 to 10 carbon atoms, an aromatic hydrocarbon group having 6 to 12 carbon atoms, or an aromatic heterocyclic group having 3 to 11 carbon atoms;

in the formula (1b): X represents a methine group or a nitrogen atom; $R_3$ represents a hydrogen atom, an aliphatic hydrocarbon group having 1 to 10 carbon atoms, an aromatic hydrocarbon group having 6 to 12 carbon atoms, or an aromatic heterocyclic group having 3 to 11 carbon atoms, provided that $R_3$ may be fused with a ring including X to form a fused ring; and in the formula (1c), Ar represents an aromatic hydrocarbon group having 6 to 50 carbon atoms or an aromatic heterocyclic group having 3 to 50 carbon atoms.

The indolocarbazole compound represented by the general formula (1) is, for example, an indolocarbazole compound represented by the following general formula (2):

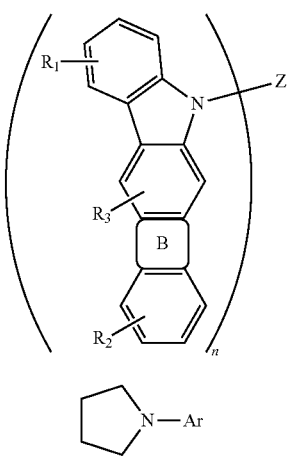

(2)

(1c)

in the general formula (2): a ring B represents a heterocycle represented by the formula (1c) to be fused with adjacent rings; Z, Ar, $R_1$, and $R_2$ have the same meanings as those in the general formula (1); $R_3$ represents a hydrogen atom, an aliphatic hydrocarbon group having 1 to 10 carbon atoms, an aromatic hydrocarbon group having 6 to 12 carbon atoms, or an aromatic heterocyclic group having 3 to 11 carbon atoms; and n represents an integer of 1 or 2.

The indolocarbazole compound represented by the general formula (2) is, for example, an indolocarbazole compound selected from compounds represented by the following general formulae (3) to (6):

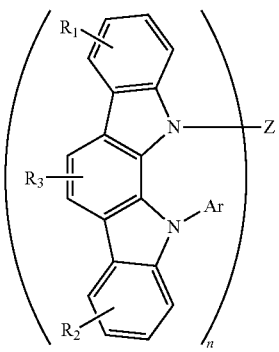

(3)

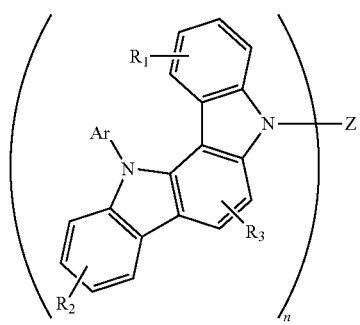

(4)

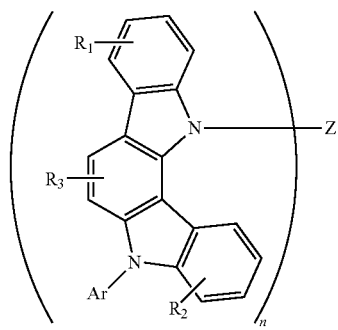

(5)

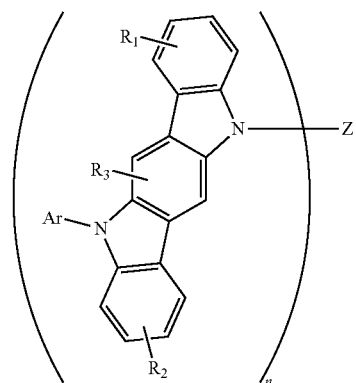

(6)

in the general formulae (3) to (6), Z, Ar, $R_1$, $R_2$, $R_3$, and n have the same meanings as those in the general formula (2).

In the above-mentioned organic electroluminescent device, it is preferred that a phosphorescent light-emitting material and an electron-transporting host material be used in combination for the light-emitting layer. In such case, the phosphorescent light-emitting material and the electron-transporting host material may each be a single compound or a mixture.

It is preferred that the above-mentioned organic electroluminescent device further include an electron-transporting layer, and at least one material of materials used for the electron-transporting layer has an electron transfer rate of $1 \times 10^{-7}$ cm$^2$/V·s or more.

It is preferred that the indolocarbazole compound contained in the above-mentioned EB layer have a LUMO energy higher than the LUMO energy of the host material contained in the light-emitting layer adjacent to the EB layer. Further, it is preferred that the LUMO energy of the indolocarbazole compound be −1.2 eV or more. For example, when the light-emitting layer uses a phosphorescent light-emitting material and an electron-transporting host material in combination, the energy is induced from the LUMO energy of the electron-transporting host material, whereas when the electron-transporting host material is a mixture, the energy is induced from the LUMO energy of a main component compound of the mixture.

Further, it is preferred that a hole-transporting material contained in the hole-transporting layer have a HOMO energy higher than the HOMO energy of the indolocarbazole compound contained in the EB layer. Further, it is preferred that the hole-transporting material contained in the hole-transporting layer adjacent to the anode or an hole-injecting layer have a HOMO energy of −4.8 eV or more.

DESCRIPTION OF EMBODIMENTS

Figure 1:
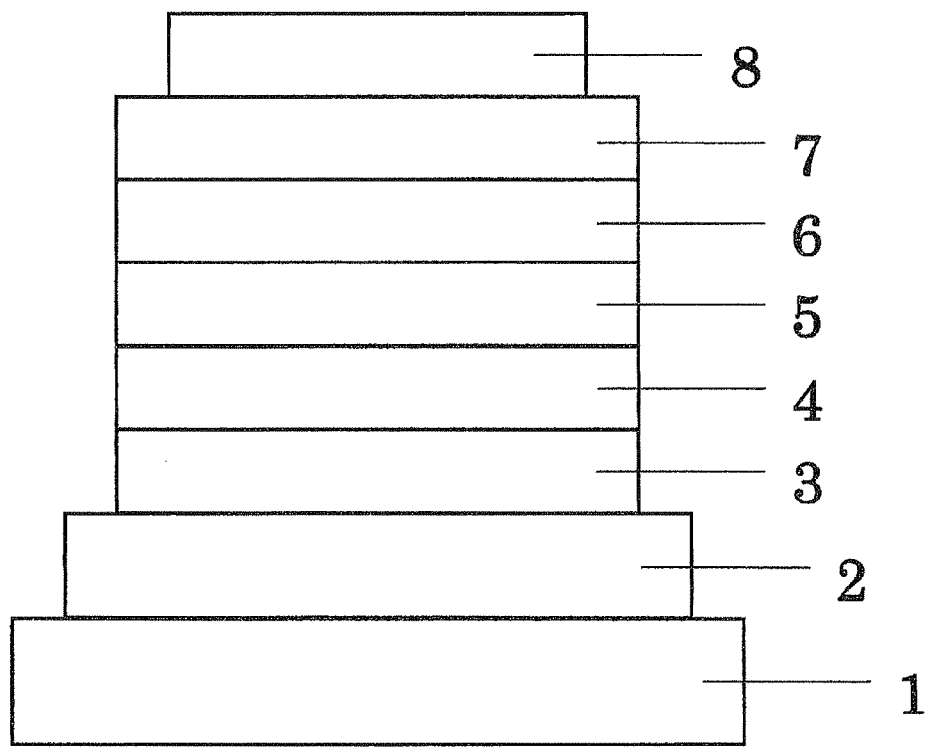
FIG. 1 shows a cross-sectional view of an example of an organic EL device.

An organic EL device of the present invention includes an anode, a cathode, and organic layers formed of a plurality of layers including at least a hole-transporting layer and a light-emitting layer, the organic layers being interposed between the anode and the cathode. In addition, the organic EL device has an EB layer adjacent to the light-emitting layer on the hole-transporting layer side, and the hole-transporting layer is arranged on the anode side viewed from the EB layer. The light-emitting layer contains a phosphorescent light-emitting material and the EB layer contains an indolocarbazole compound represented by the above-mentioned general formula (1).

Some of the indolocarbazole compounds each represented by the general formula (1) are known in the above-mentioned patent literatures and the like, and vary in their usage forms. However, the indolocarbazole compounds known as hole-transporting materials may be used advantageously.

The indolocarbazole compound to be used in the present invention is represented by the general formula (1), and in the formula: Z represents an n-valent aromatic hydrocarbon group having 6 to 50 carbon atoms or an aromatic heterocyclic group having 3 to 50 carbon atoms; n represents an integer of 1 to 6; and Y represents a group having an indolocarbazole skeleton represented by the formula (1a). Each of such aromatic hydrocarbon group and aromatic heterocyclic group may or may not have a substituent.

Preferred specific examples of the aromatic hydrocarbon group and aromatic heterocyclic group having no substituent include n-valent groups each produced by removing n hydrogen atoms from benzene, pyridine, pyrimidine, triazine, indole, carbazole, naphthalene, quinoline, isoquinoline, quinoxaline, naphthyridine, or an aromatic compound in which a plurality of those aromatic rings are linked together. Of those, n-valent groups each produced by removing hydrogen atom(s) from benzene, pyridine, pyrimidine, triazine, indole, carbazole, naphthalene, or an aromatic compound in which a plurality of those aromatic rings are linked together are more preferably given. It should be noted that in the case of the group produced from an aromatic compound in which a plurality of aromatic rings are linked together, the number of the aromatic rings to be linked together is preferably 2 to 10, more preferably 2 to 7. In that case, the position at which the group is linked to Y is not limited, and may be on a terminal ring or on a middle ring.

Here, when the group produced from an aromatic compound in which a plurality of aromatic rings are linked together is a divalent group, the group is, for example, represented by any one of the following formulae.

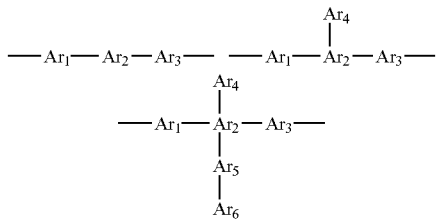

(Ar$_1$ to Ar$_6$ each represent a non-substituted monocyclic or fused aromatic ring.)

Specific examples of the above-mentioned group produced by removing a hydrogen atom from an aromatic compound in which a plurality of aromatic rings are linked together include n-valent groups each produced by removing a hydrogen atom from, for example, biphenyl, terphenyl, bipyridine, bipyrimidine, bitriazine, terpyridine, bistriazylbenzene, dicarbazolylbenzene, carbazolylbiphenyl, dicarbazolylbiphenyl, phenylterphenyl, carbazolylterphenyl, binaphthalene, phenylpyridine, phenylcarbazole, diphenylcarbazole, diphenylpyridine, phenylpyrimidine, diphenylpyrimidine, phenyltriazine, diphenyltriazine, phenylnaphthalene, or diphenylnaphthalene.

When the above-mentioned aromatic hydrocarbon group or aromatic heterocyclic group has a substituent, the substituent is preferably an alkyl group having 1 to 4 carbon atoms, an alkoxy group having 1 or 2 carbon atoms, an acetyl group, or a diarylamino group having 6 to 24 carbon atoms, more preferably a methyl group or a diphenylamino group. It should be noted that the group produced from an aromatic compound in which a plurality of aromatic rings are linked together may also have a substituent similarly.

When the above-mentioned aromatic hydrocarbon group or aromatic heterocyclic group has a substituent, the total number of substituents is 1 to 10, preferably 1 to 6, more preferably 1 to 4. Further, the above-mentioned aromatic hydrocarbon group or aromatic heterocyclic group has two or more substituents, the substituents may be identical to or different from each other. Further, in the calculation of carbon atoms in the above-mentioned aromatic hydrocarbon group or aromatic heterocyclic group, when the group has a substituent, the number of carbon atoms to be calculated includes the number of carbon atoms in the substituent.

In the general formula (1), n represents an integer of 1 to 6, preferably 1 to 4, more preferably 1 to 3.

In the general formula (1), Y is represented by the formula (1a), a ring A in the formula (1a) is represented by the formula (1b). In the formula (1b), X represents a methine group or a nitrogen atom. $R_3$ represents a hydrogen atom, an aliphatic hydrocarbon group having 1 to 10 carbon atoms, an aromatic hydrocarbon group having 6 to 12 carbon atoms, an aromatic heterocyclic group having 3 to 11 carbon atoms, or a group to be fused with a six-membered ring including X. When $R_3$ represents a group to be fused with a six-membered ring including X, a ring obtained by removing the six-membered ring including X from a fused ring formed by fusion may be, for example, a pyrrole ring, a furan ring, a thiophene ring, an indole ring, a benzofuran ring, a benzothiophene ring, a benzene ring, or a naphthalene ring. Such ring may have a substituent and is preferably an indole ring which may have a substituent. In that case, it is recommended to form a carbazole ring including the six-membered ring including X. The case where $R_3$ is fused with the six-membered ring including X is the case where a carbon atom at the position adjacent to the position at which the six-membered ring including X is substituted by $R_3$ has a hydrogen atom which may be substituted, and is further limited to the case where X represents a methine group when a carbazole ring is formed.

In the formula (1a), a ring B is represented by the formula (1c). In the formula (1c), Ar represents an aromatic hydrocarbon group having 6 to 50 carbon atoms or an aromatic heterocyclic group having 3 to 50 carbon atoms. Each of such aromatic hydrocarbon group and aromatic heterocyclic group may or may not have a substituent. Preferred examples of such aromatic hydrocarbon group and aromatic heterocyclic group are as described for the above-mentioned aromatic hydrocarbon group or aromatic heterocyclic group that constructs Z except that the groups are monovalent groups. Further, no limitation is imposed on substitution positions of N and Ar in the formula (1c).

Preferred specific examples of the aromatic hydrocarbon group and aromatic heterocyclic group having no substituent include monovalent groups each produced from benzene, pyridine, pyrimidine, triazine, indole, carbazole, naphthalene, quinoline, isoquinoline, quinoxaline, or naphthyridine. Of those, monovalent groups each produced from benzene, pyridine, pyrimidine, triazine, indole, carbazole, or naphthalene are more preferably given. Further, a monovalent group produced from an aromatic compound in which a plurality of those aromatic rings are linked together is also preferably given. Examples thereof include monovalent groups each produced from, for example, biphenyl, terphenyl, bipyridine, bipyrimidine, bitriazine, terpyridine, bistriazylbenzene, dicarbazolylbenzene, carbazolylbiphenyl, dicarbazolylbiphenyl, phenylterphenyl, carbazoylterphenyl, binaphthalene, phenylpyridine, phenylcarbazole, diphenylcarbazole, diphenylpyridine, phenylpyrimidine, diphenylpyrimidine, phenyltriazine, diphenyltriazine, phenylnaphthalene, or diphenylnaphthalene. Further, when the group has a substituent, the substituent is preferably an alkyl group having 1 to 4 carbon atoms, an alkoxy group having 1 or 2 carbon atoms, an acetyl group, or a diarylamino group having 6 to 24 carbon atoms, more preferably a methyl group or a diphenylamino group.

In the formula (1a), $R_1$ and $R_2$ each independently represent a hydrogen atom, an aliphatic hydrocarbon group having 1 to 10 carbon atoms, an aromatic hydrocarbon group having 6 to 12 carbon atoms, or an aromatic heterocyclic group having 3 to 11 carbon atoms, preferably a hydrogen atom, an alkyl group having 1 to 4 carbon atoms, a phenyl group, a pyridyl group, a pyrimidyl group, a triazyl group, a naphthyl group, a biphenylyl group, a bipyrimiridyl group, or a carbazolyl group, more preferably a hydrogen atom, a phenyl group, or a carbazolyl group.

It should be noted that when $R_1$, $R_2$, and $R_3$ described above each represent an aliphatic hydrocarbon group having 1 to 10 carbon atoms, an aromatic hydrocarbon group having 6 to 12 carbon atoms, or an aromatic heterocyclic group having 3 to 11 carbon atoms, preferred groups thereof are common.

As the indolocarbazole compound represented by the above-mentioned general formula (1), an indolocarbazole compound represented by the general formula (2) is given as preferred one.

In the general formula (2), a ring B represents a heterocycle represented by the formula (1c) to be fused with adjacent rings. The ring B or formula (1c) has the same meaning as the ring B or formula (1c) in the general formula (1). Further, Z, Ar, $R_1$, and $R_2$ have the same meanings as Z, Ar, $R_1$, and $R_2$ in the general formula (1). $R_3$ represents a hydrogen atom, an alkyl group having 1 to 10 carbon atoms, an aromatic hydrocarbon group having 6 to 12 carbon atoms, or an aromatic heterocyclic group having 3 to 11 carbon atoms. Here, it is preferred that the above-mentioned aromatic hydrocarbon group and aromatic heterocyclic group have no fused ring structure. n represents an integer of 1 or 2.

As the indolocarbazole compound represented by the above-mentioned general formula (2), an indolocarbazole compound represented by any one of the general formulae (3) to (6) is given as preferred one.

In the general formulae (3) to (6), Z, Ar, $R_1$, $R_2$, $R_3$, and n have the same meanings as those in the general formula (2).

The indolocarbazole compounds represented by the general formulae (1) to (6) may be synthesized using known techniques.

For example, an indolocarbazole skeleton of the indolocarbazole compound represented by the general formula (3) may be synthesized in accordance with the following reaction formula with reference to synthesis examples disclosed in Synlett, 2005, No. 1, p 42-48.

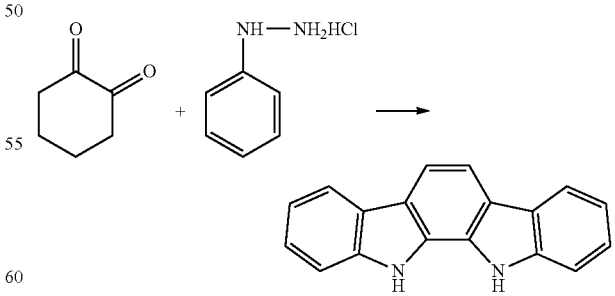

Further, indolocarbazole skeletons represented by the general formulae (4) and (5) may be synthesized in accordance with the following reaction formulae with reference to synthesis examples disclosed in The Journal of Organic Chemistry, 2007, 72(15)5886 and Tetrahedron, 1999, 55, p 2371.

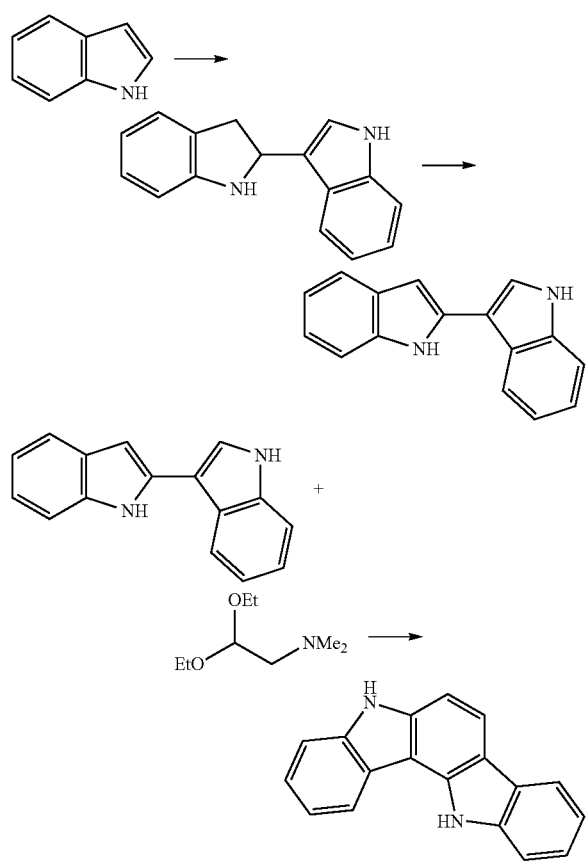

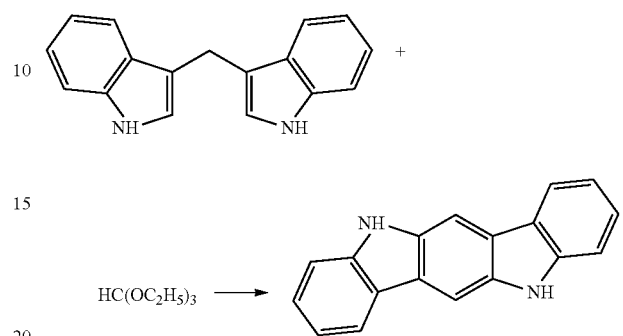

In addition, an indolocarbazole skeleton represented by the general formula (6) may be synthesized in accordance with the following reaction formula with reference to synthesis examples disclosed in Archiv der Pharmazie (Weinheim, Germany), 1987, 320 (3), p 280-2.

The indolocarbazole compounds of the present invention represented by the general formulae (1) to (6) may be synthesized by subjecting the respective indolocarbazoles obtained in accordance with the above-mentioned reaction formulae to coupling reactions with the corresponding halogen-substituted aromatic compounds and the like to substitute hydrogen atoms, which are substituents of two nitrogen atoms present in each of the indolocarbazole skeletons, by aromatic groups.

Hereinafter, there are given preferred specific examples of the indolocarbazole compounds represented by the general formulae (1) to (6). However, the indolocarbazole compound to be used in the present invention is not limited thereto.

1-1

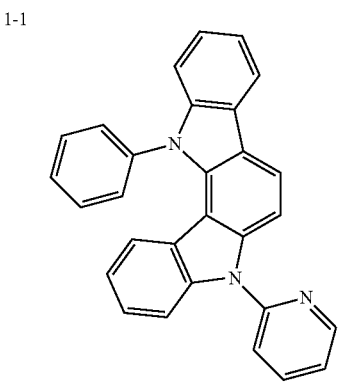

1-2

1-3

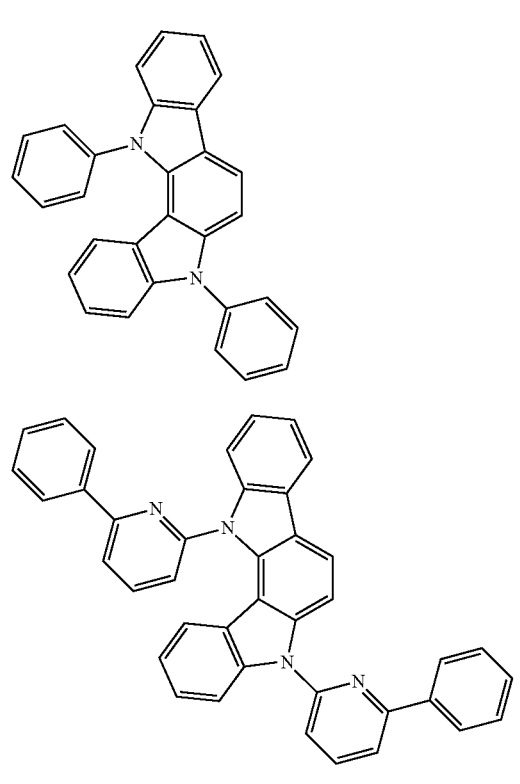

1-4

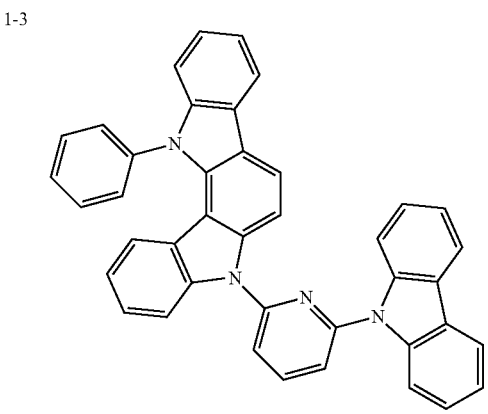

-continued
1-5
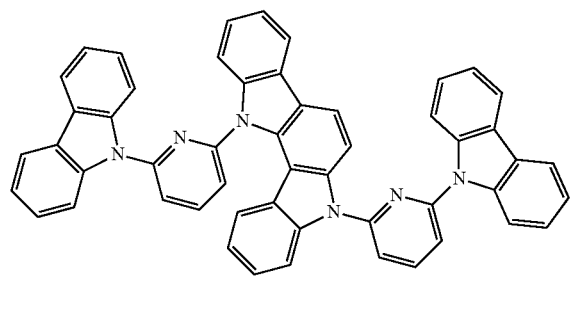
1-6
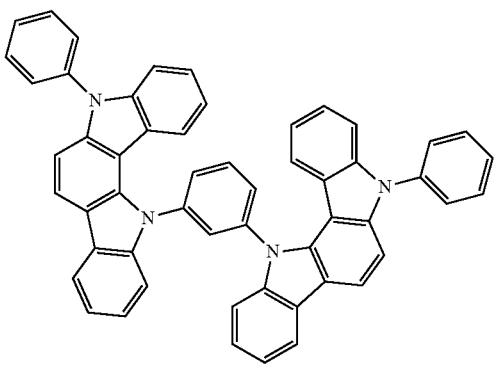
1-7
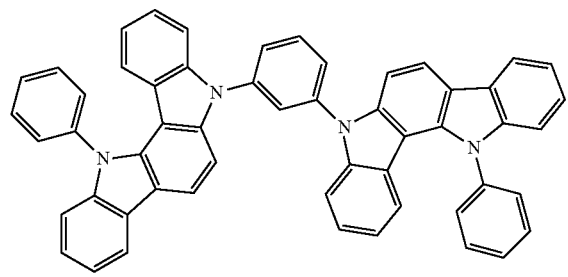
1-8
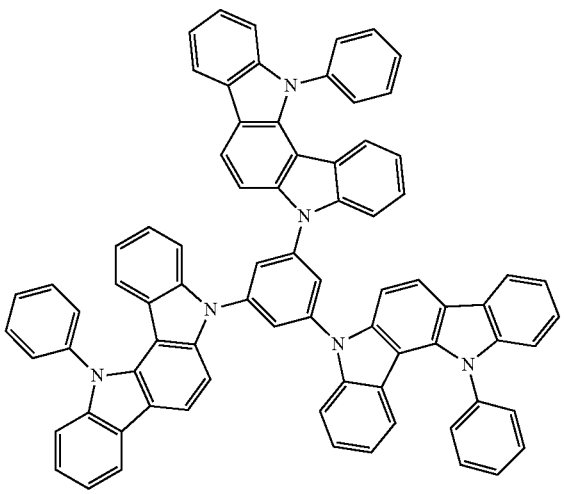
1-9
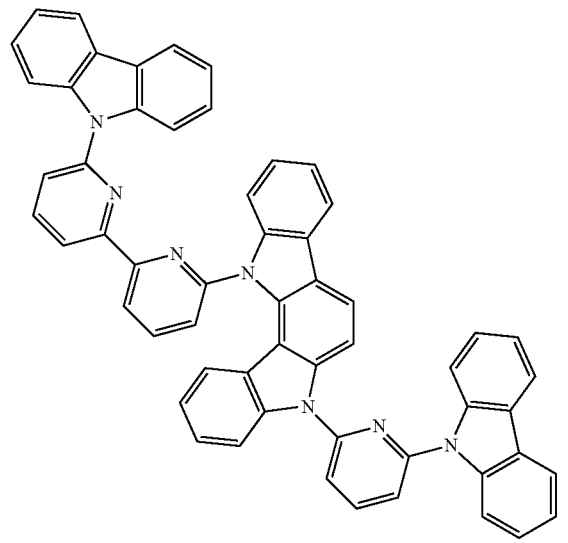
1-10
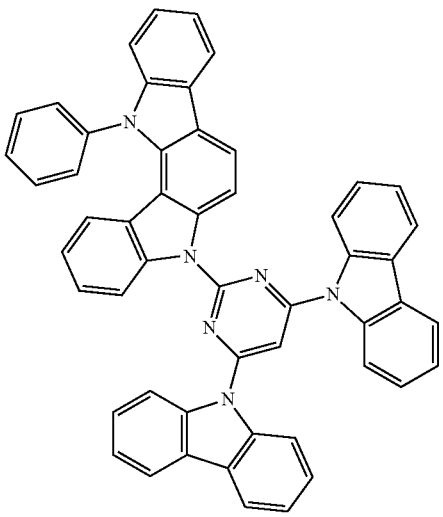

-continued
1-11
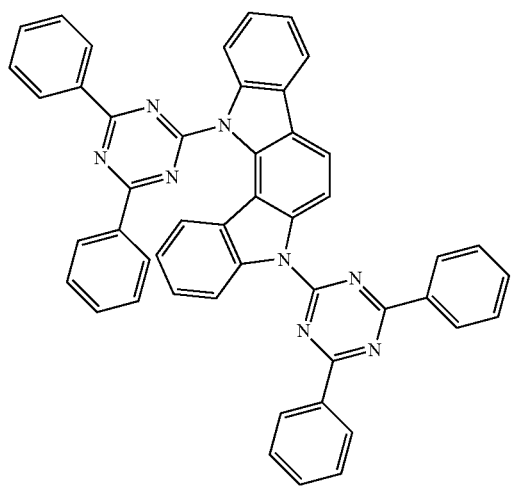
1-12
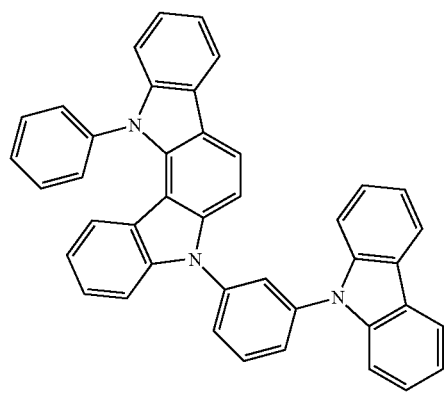
1-13
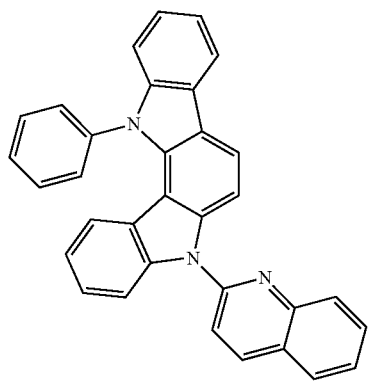
1-14
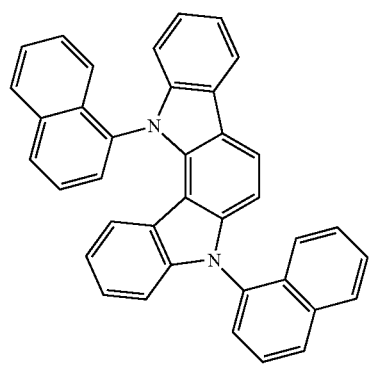
1-15
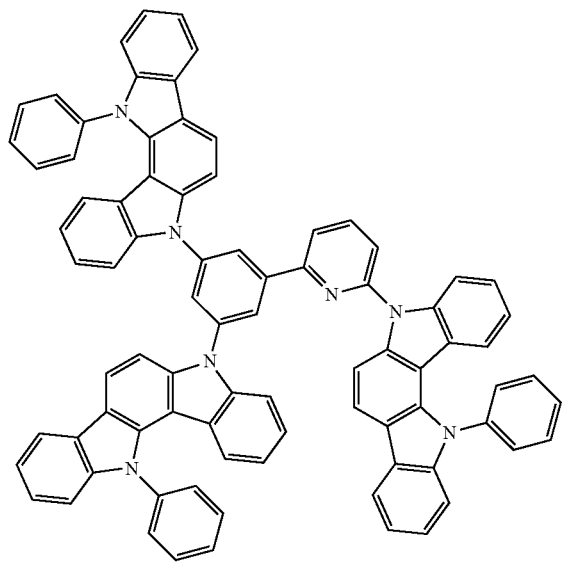
1-16
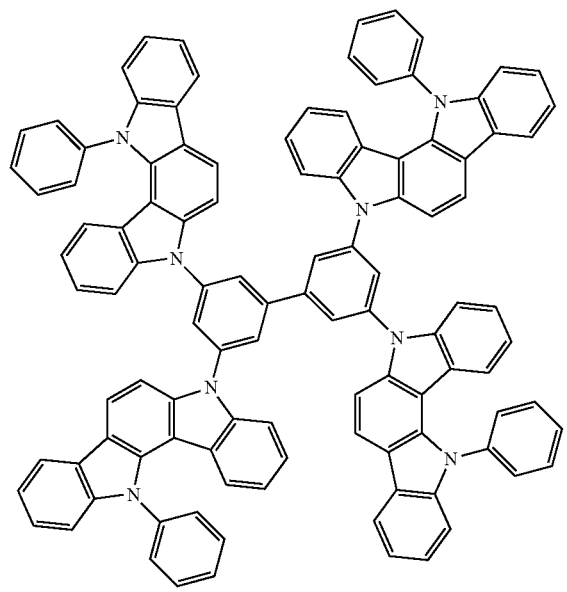

-continued
1-17
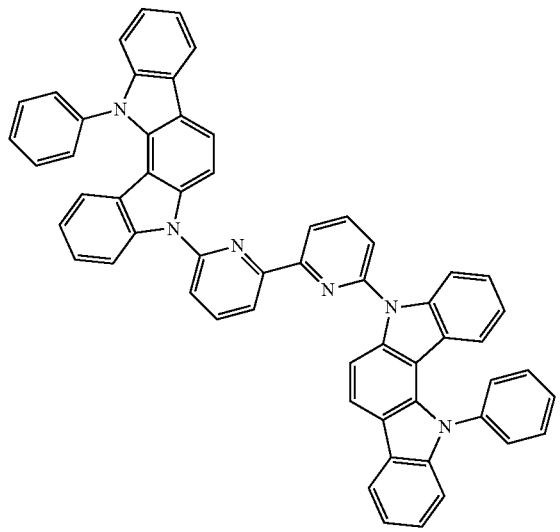
1-18
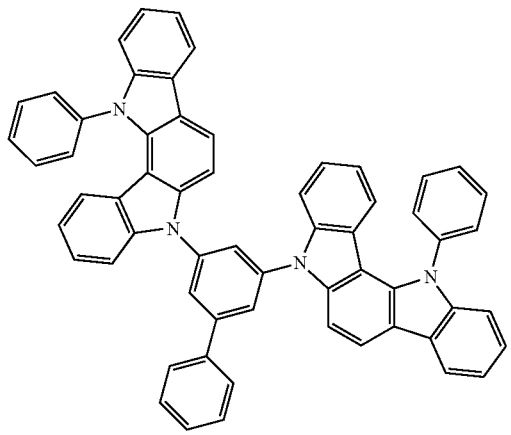
1-19
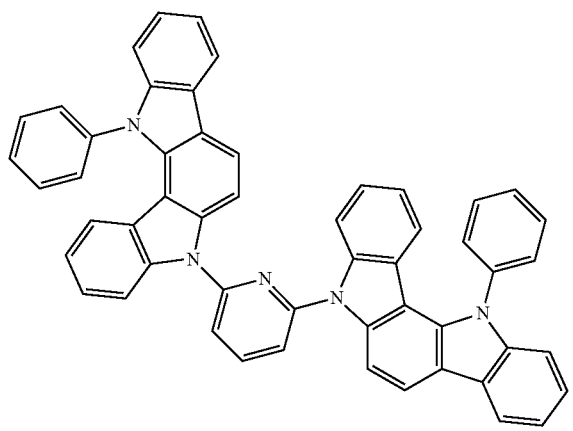
1-20
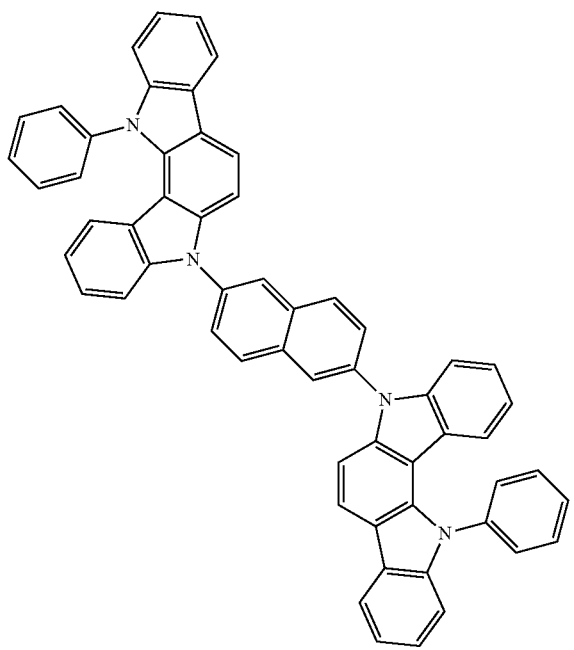
1-21
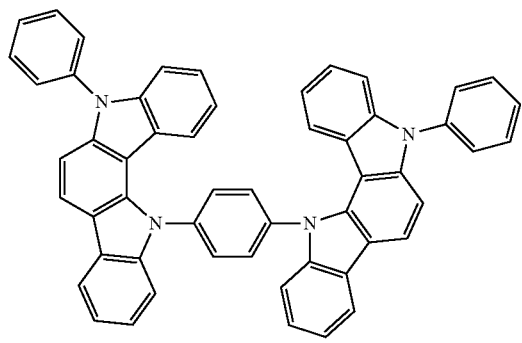
1-22
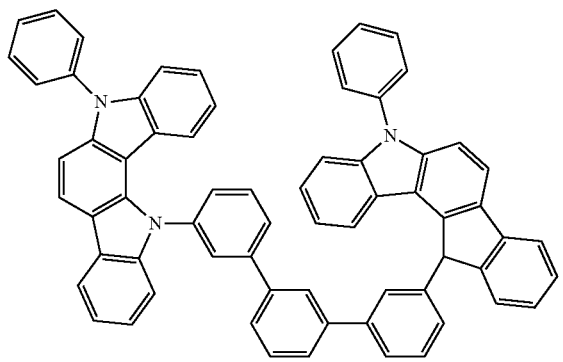

-continued
1-23
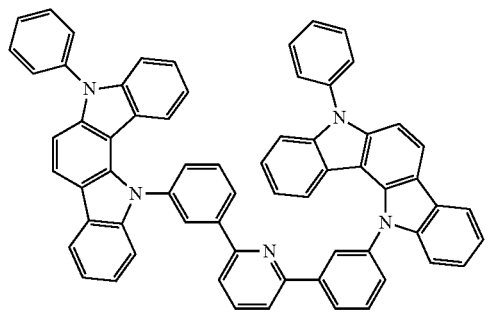
1-24
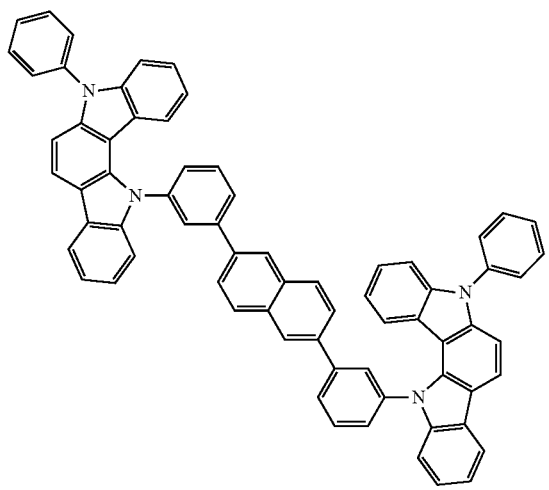
1-25
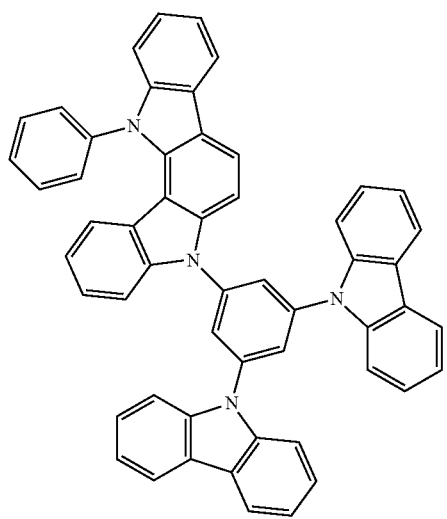
1-26
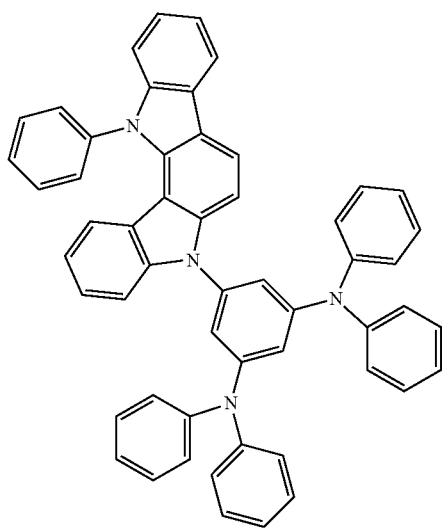
1-27
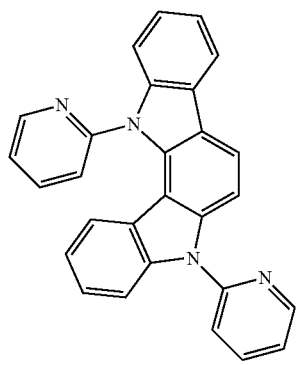
1-28
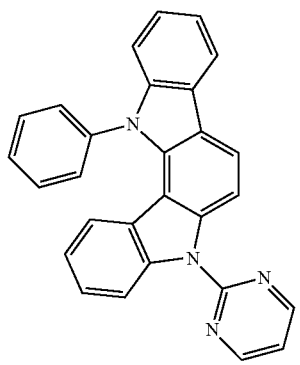

-continued
1-29
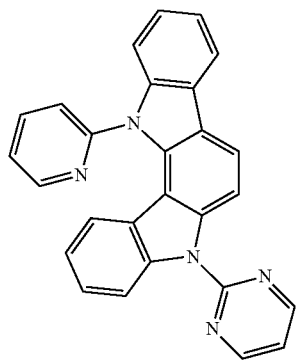
1-30
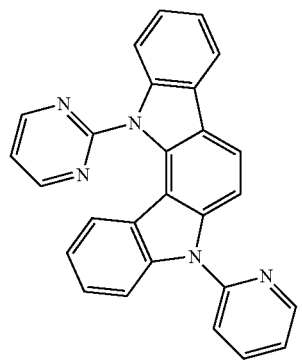
1-31
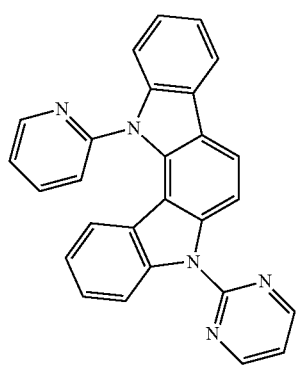
1-32
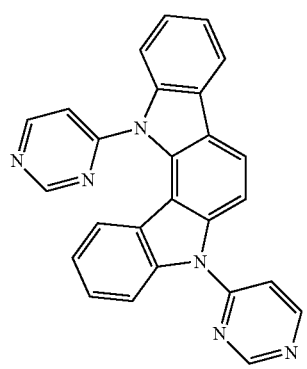
1-33
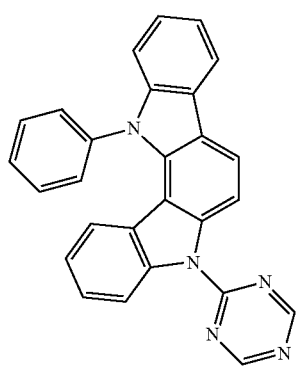
1-34
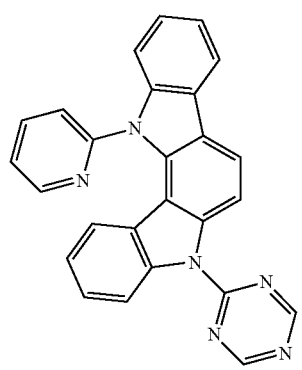
1-35
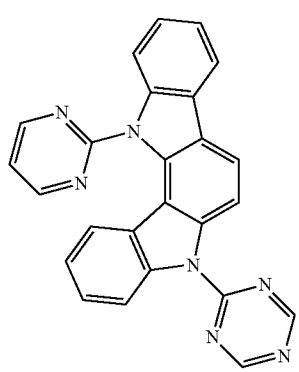
1-36
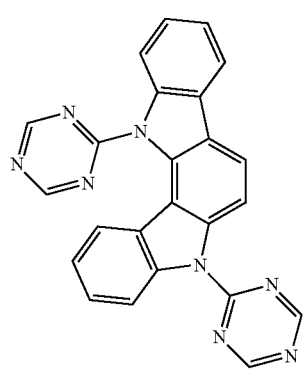

-continued
1-37
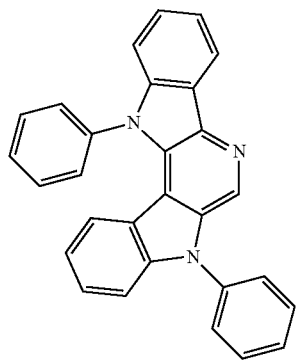
1-38
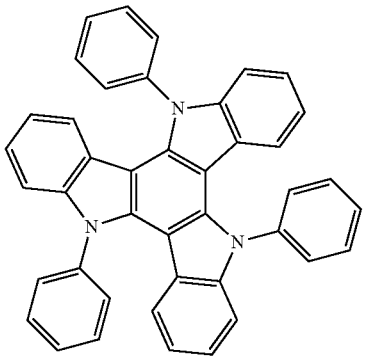
1-39
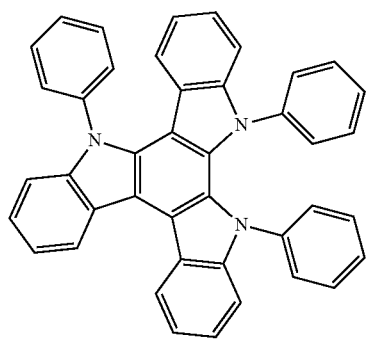
1-40
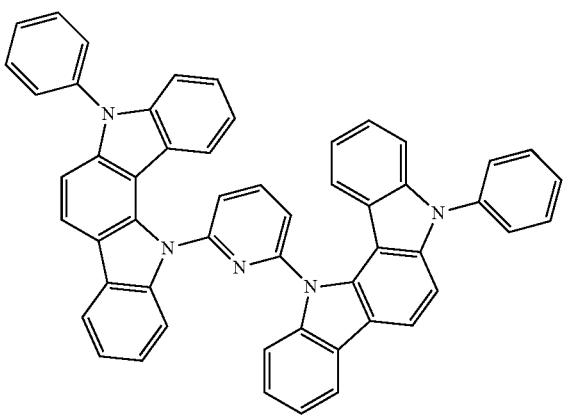
2-1
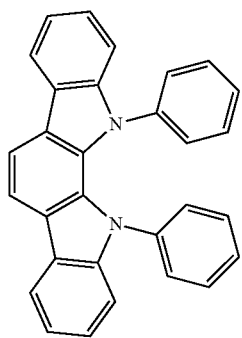
2-2
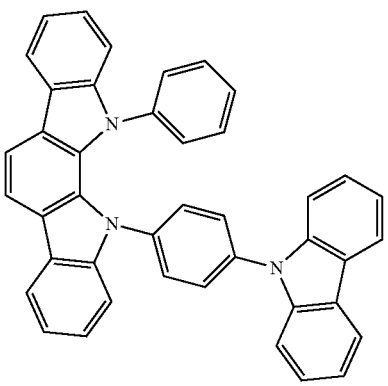

-continued
2-3
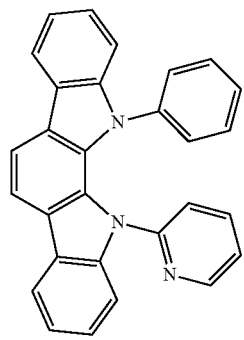
2-4
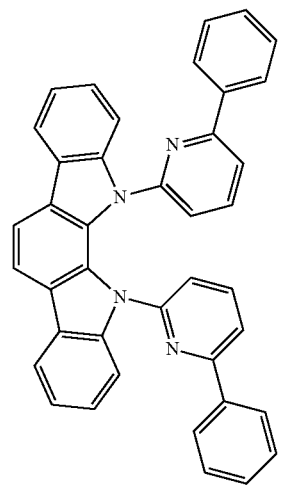
2-5
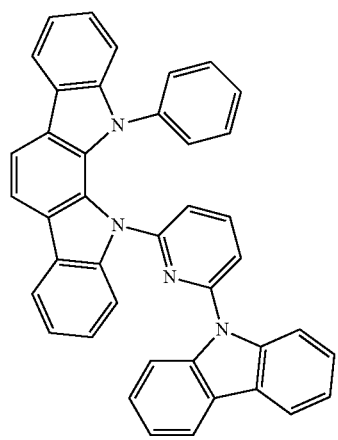
2-6
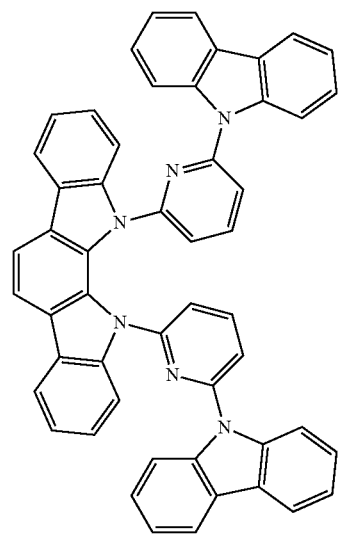
2-7
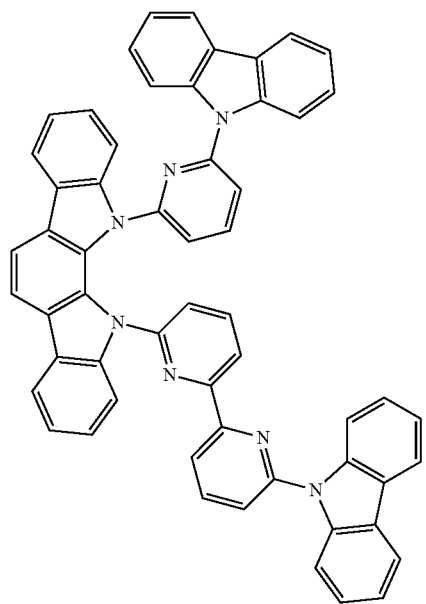
2-8
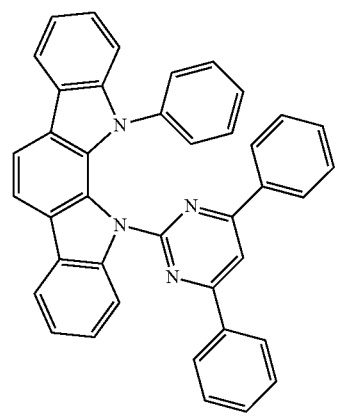

-continued
2-9
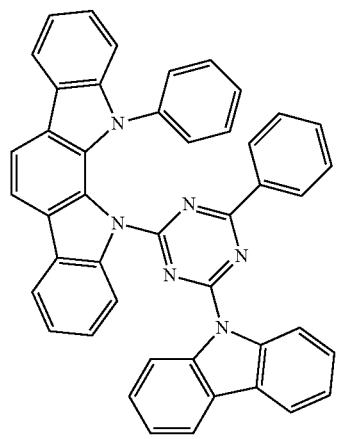
2-10
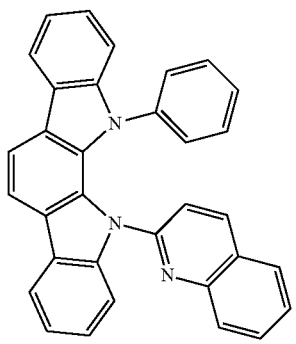
2-11
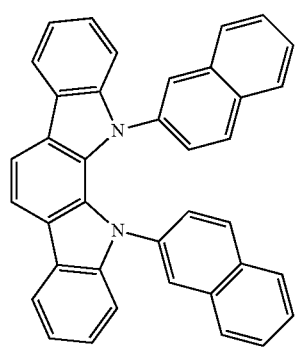
2-12
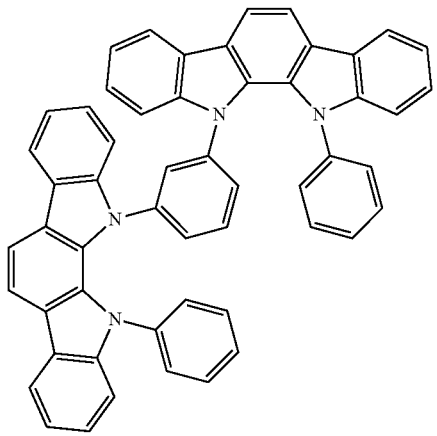
2-13
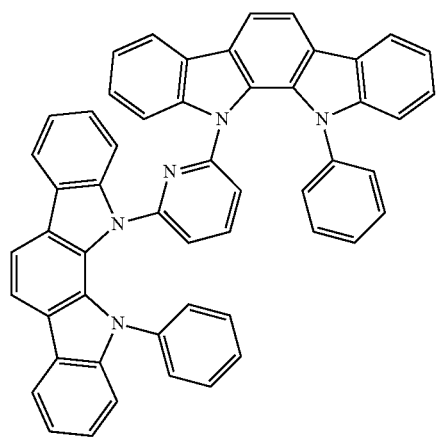
2-14
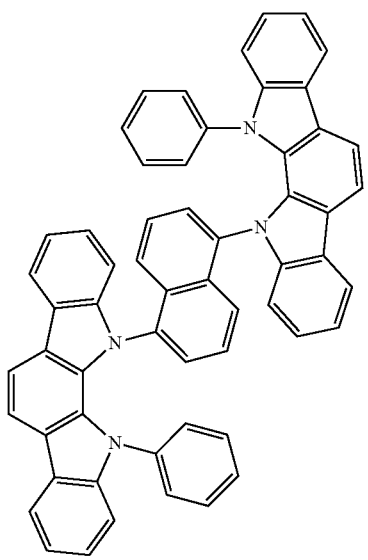

-continued
| 2-15 | 2-16 |
|---|---|
| 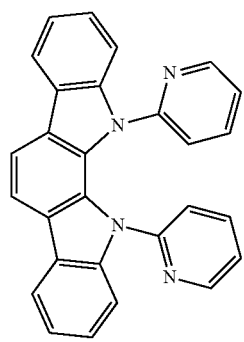 | 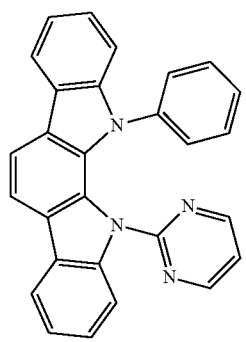 |
| 2-17 | 2-18 |
|---|---|
| 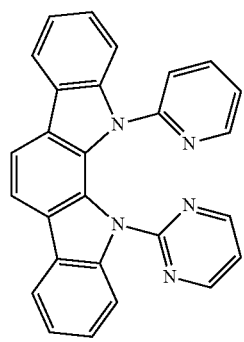 | 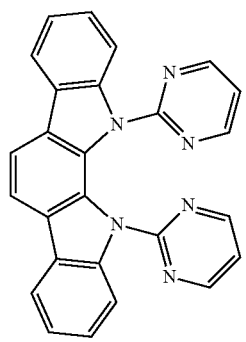 |
| 2-19 | 2-20 |
|---|---|
| 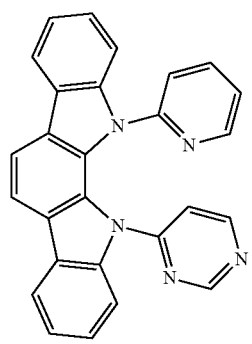 | 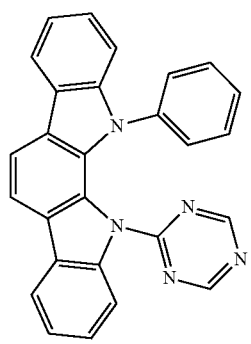 |
| 2-21 | 2-22 |
|---|---|
| 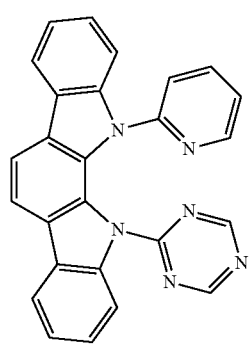 | 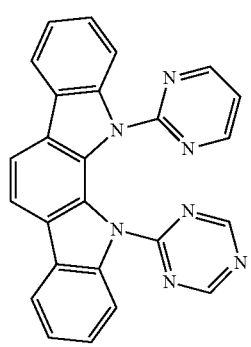 |

-continued
2-23
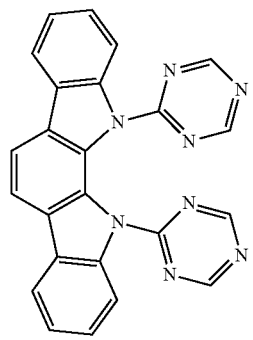
2-24
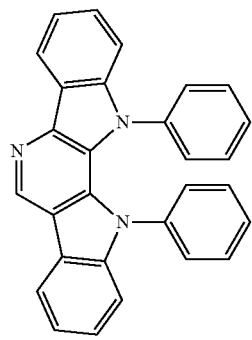
3-1
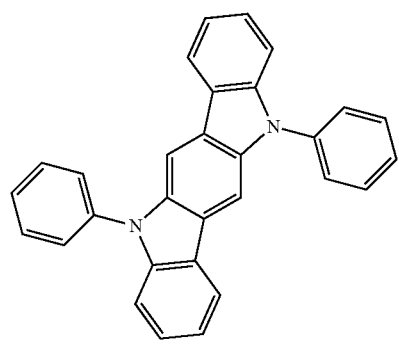
3-2
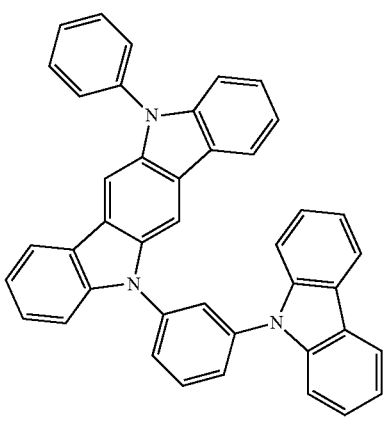
3-3
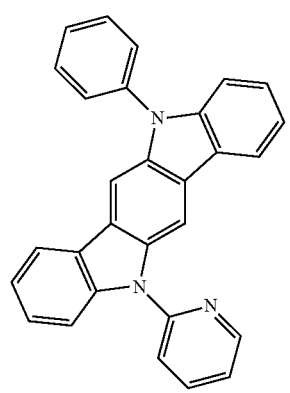
3-4
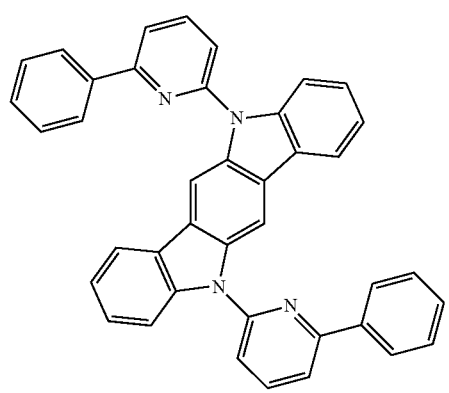
3-5
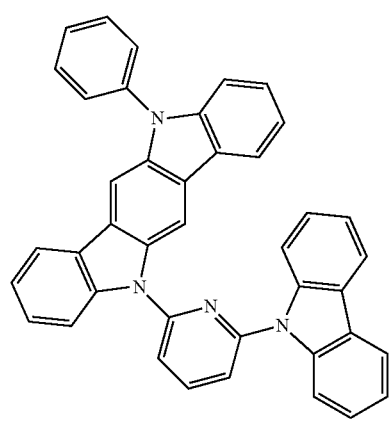
3-6
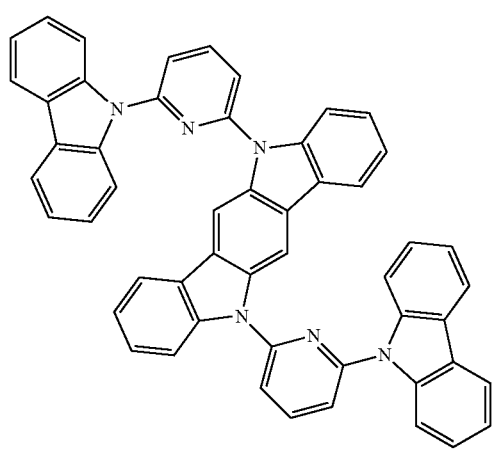

-continued
3-7
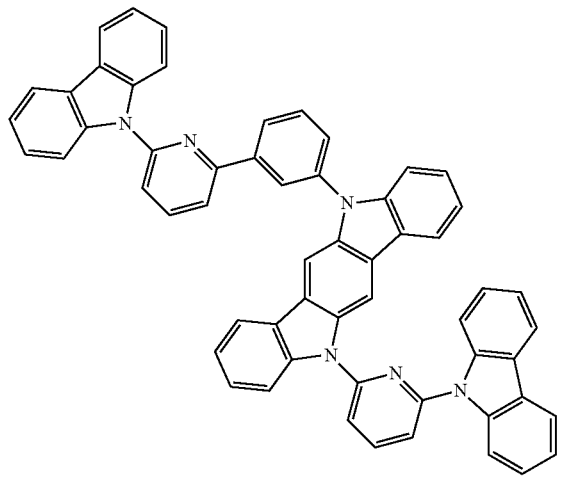
3-8
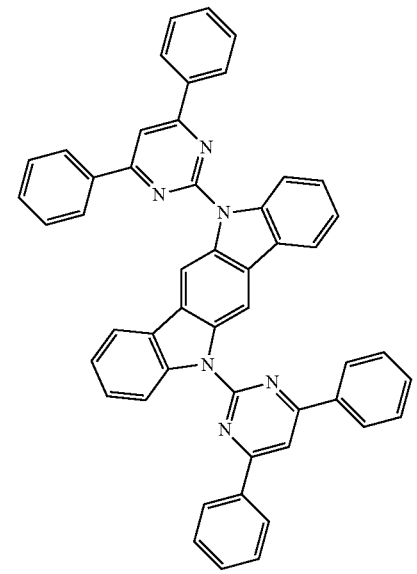
3-9
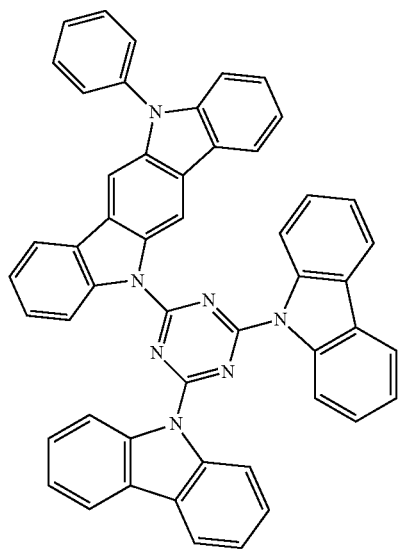
3-10
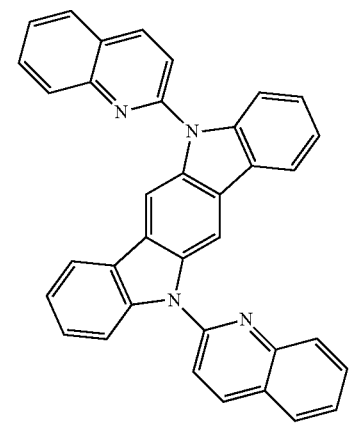
3-11
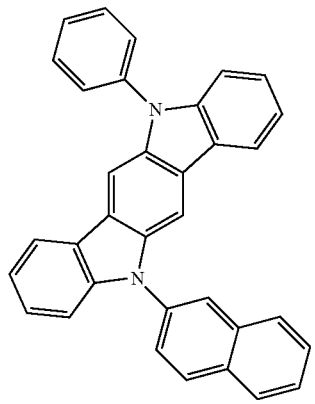
3-12
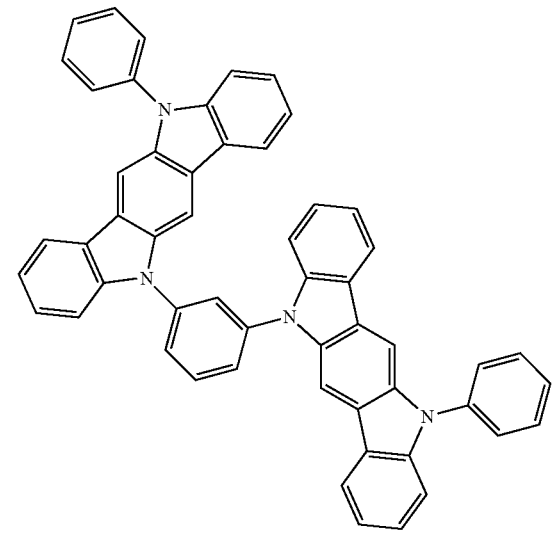

-continued
3-13
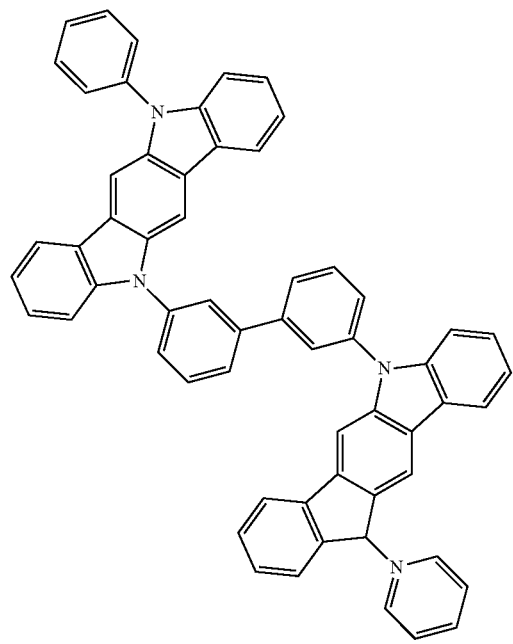
3-14
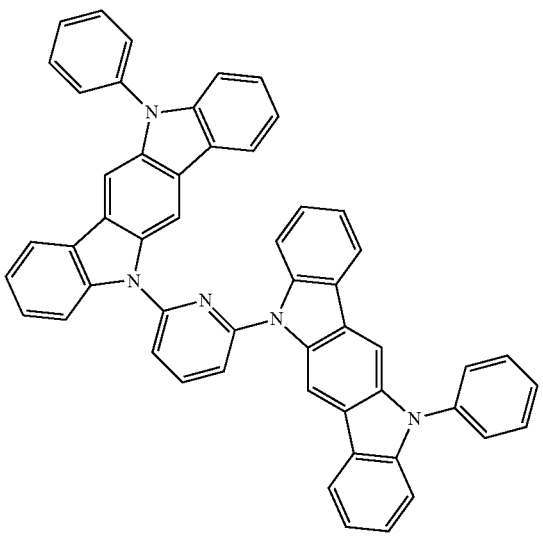
3-15
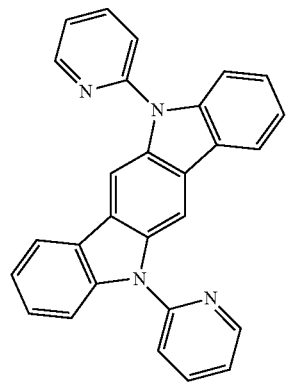
3-16
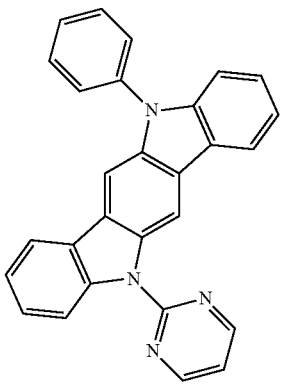
3-17
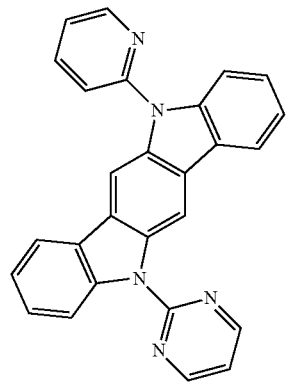
3-18
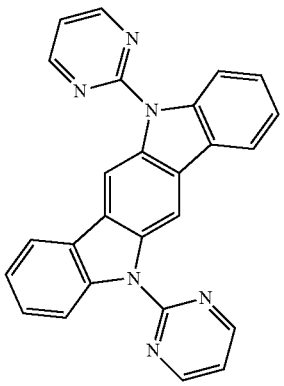

-continued
3-19
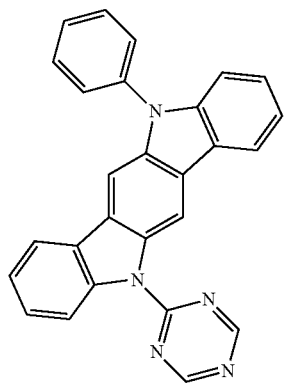
3-20
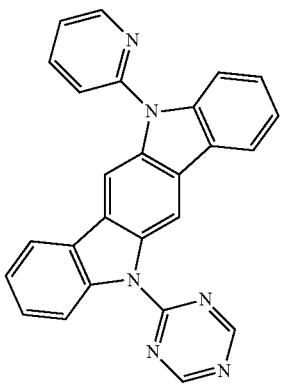
3-21
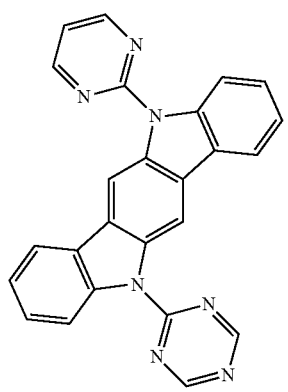
3-22
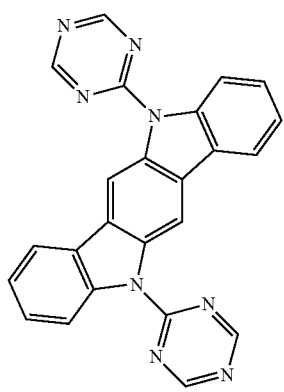
3-23
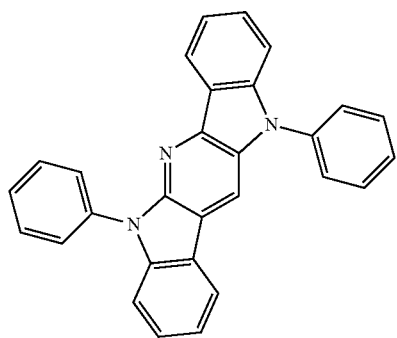
4-1
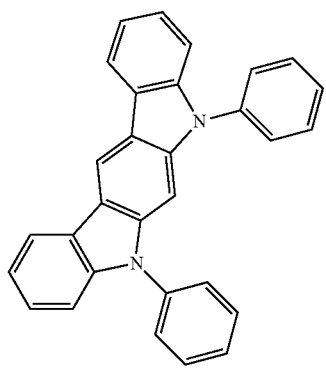
4-2
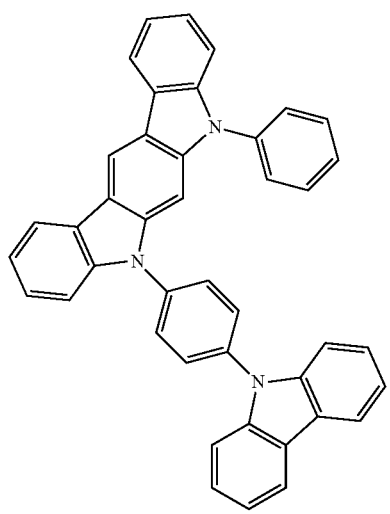
4-3
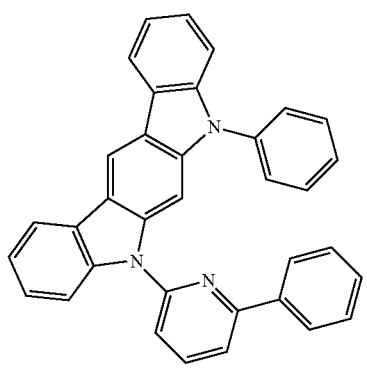

-continued
4-4
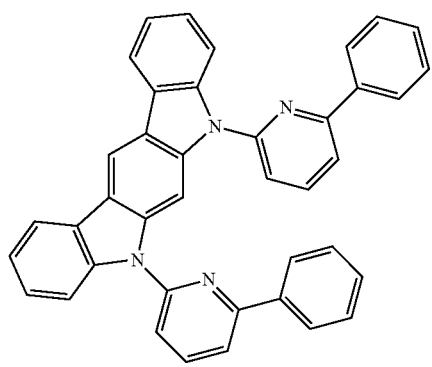
4-5
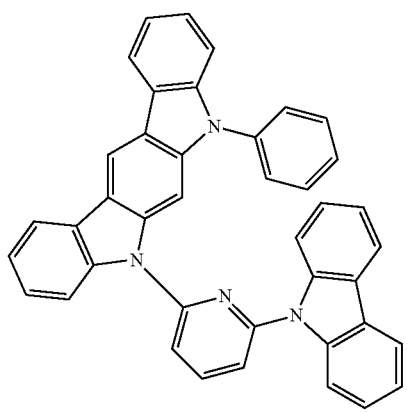
4-6
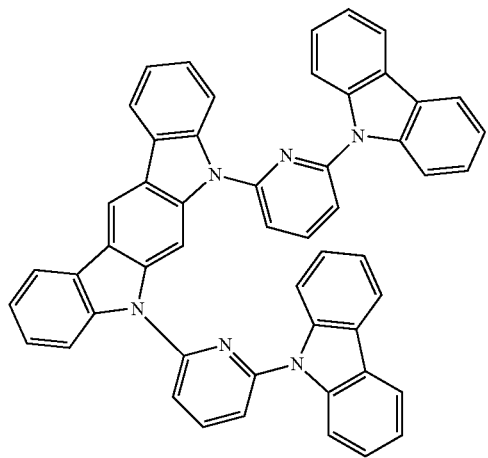
4-7
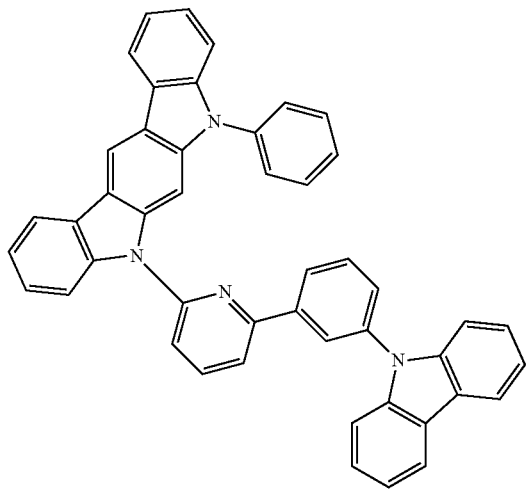
4-8
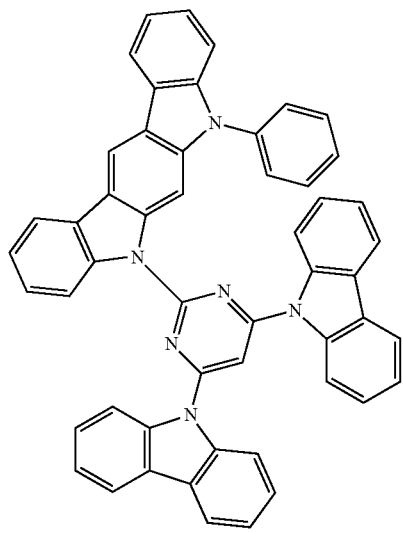
4-9
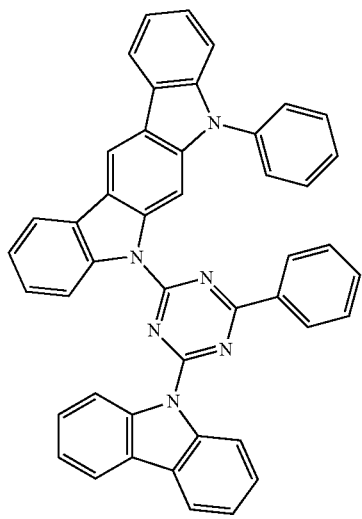

-continued
4-10
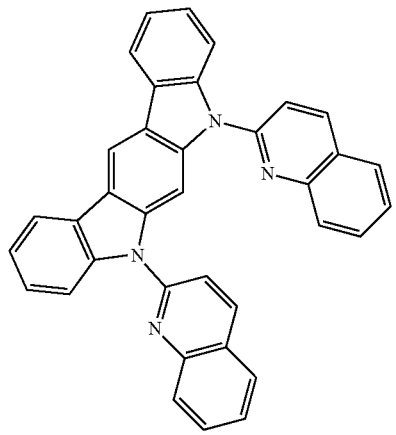
4-11
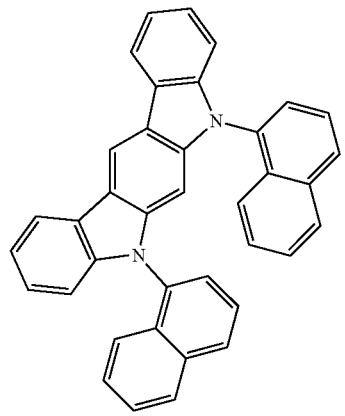
4-12
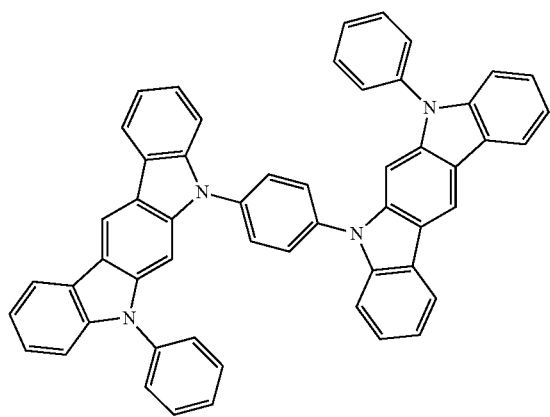
4-13
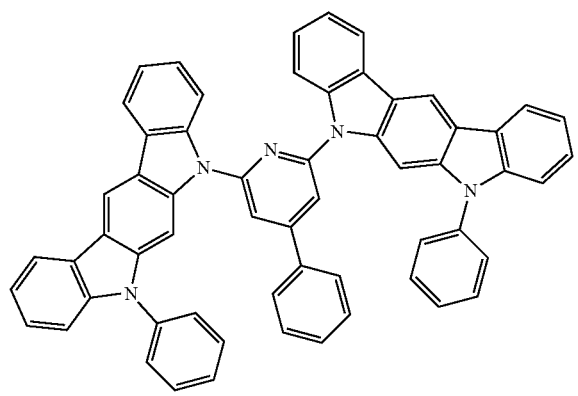
4-14
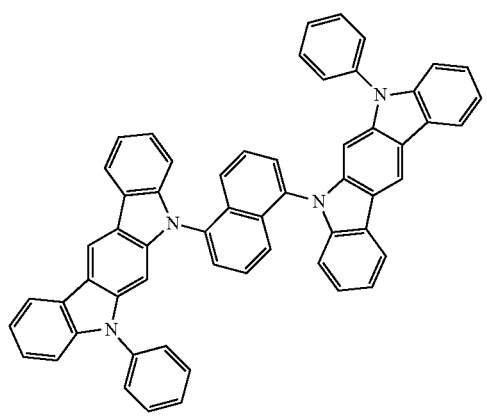
4-15
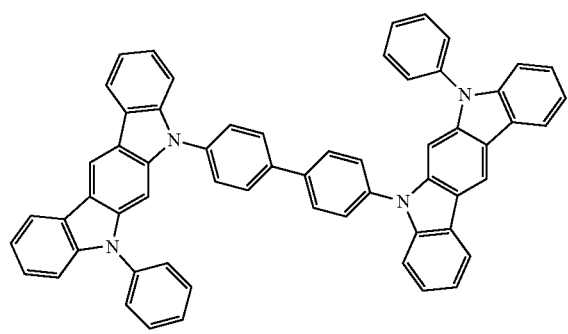

-continued
4-16
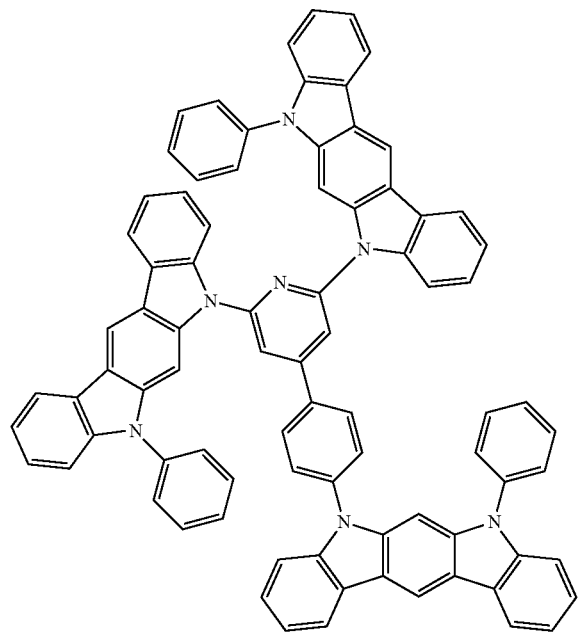
4-17
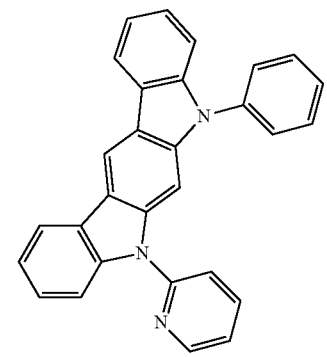
4-18
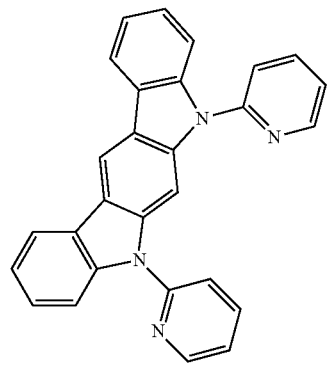
4-19
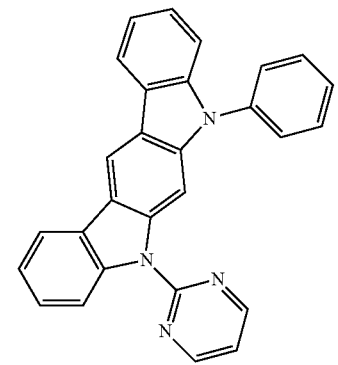
4-20
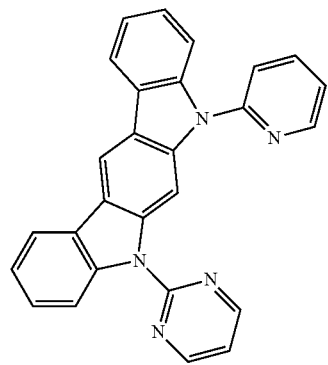
4-21
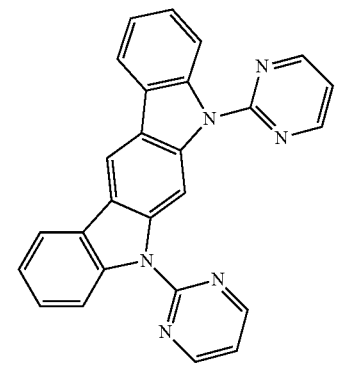

-continued
4-22
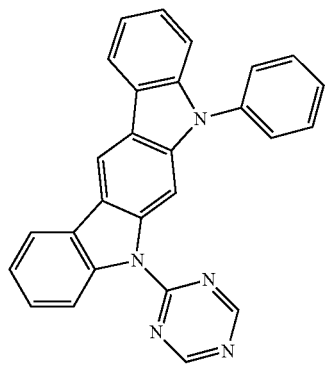
4-23
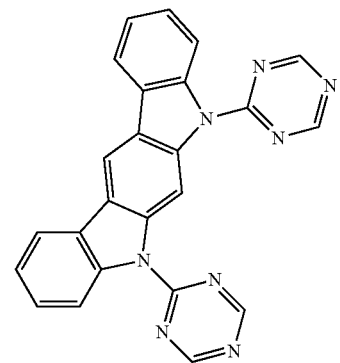
4-24
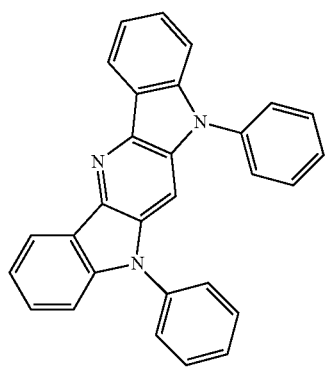
5-1
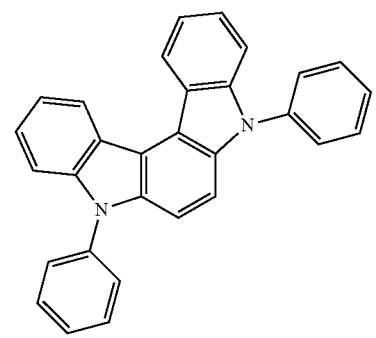
5-2
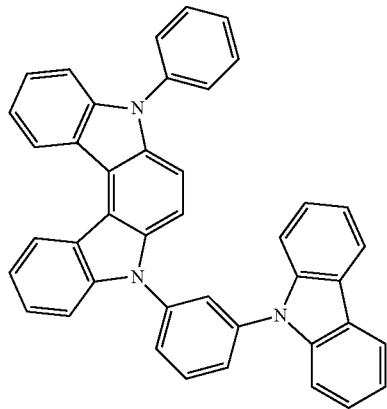
5-3
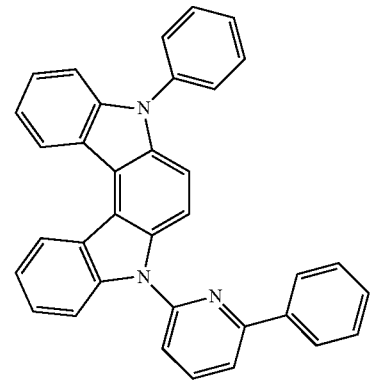
5-4
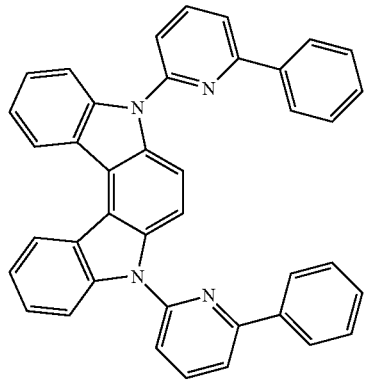
5-5
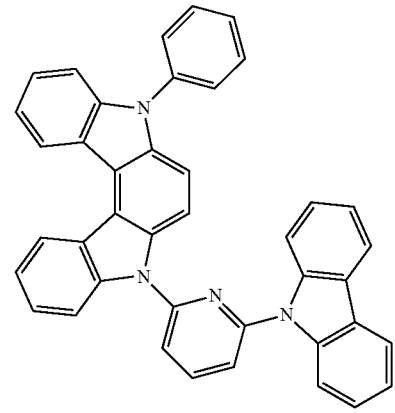

-continued
5-6
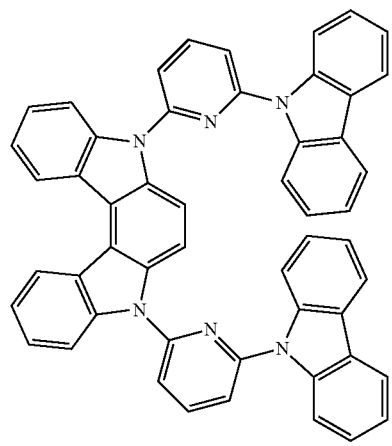
5-7
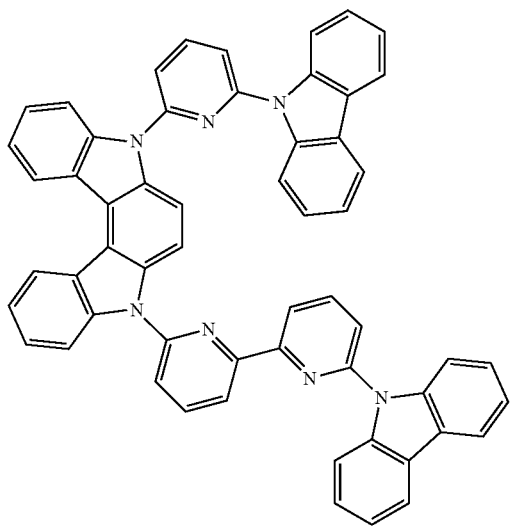
5-8
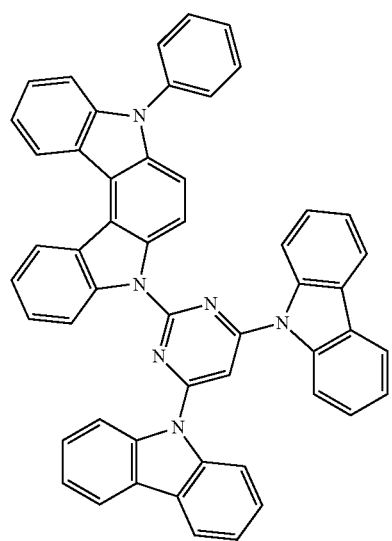
5-9
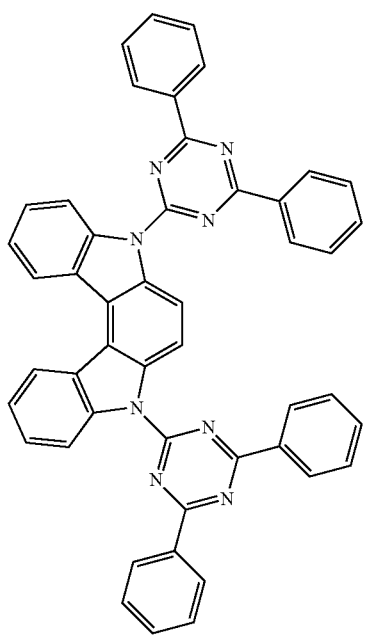
5-10
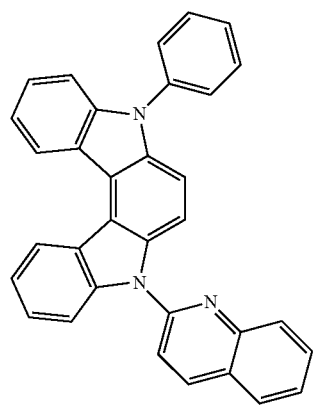
5-11
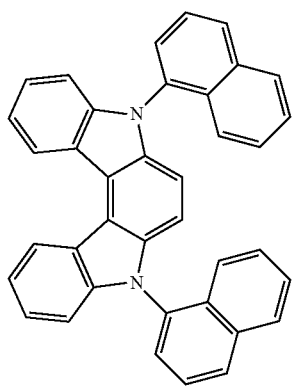

-continued
5-12
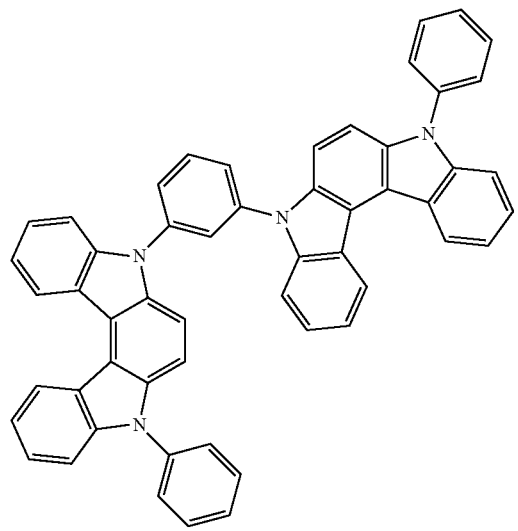
5-13
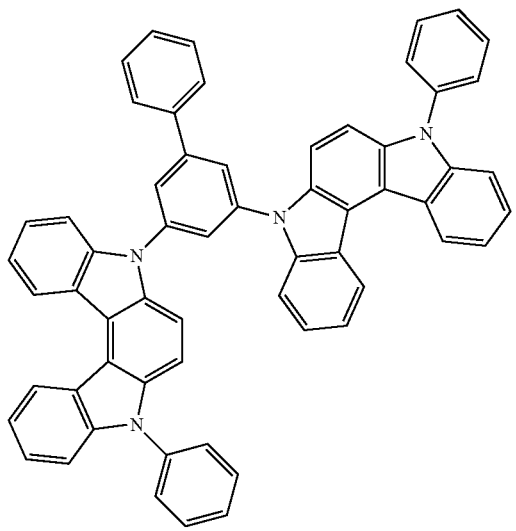
5-14
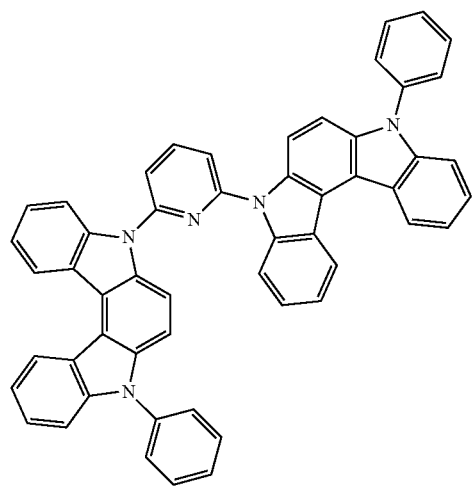
5-15
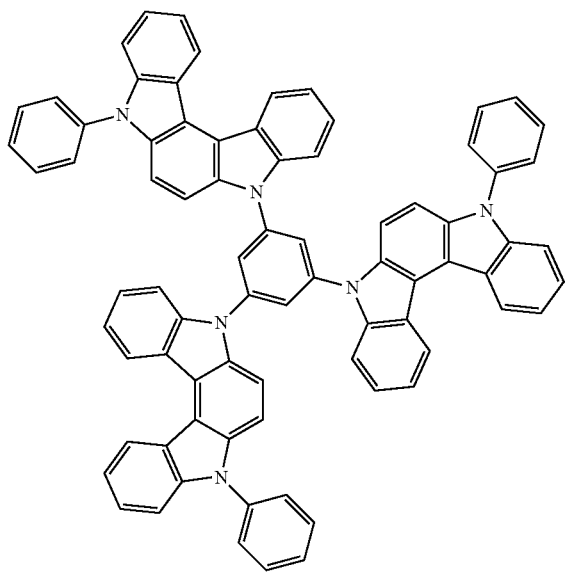
5-16
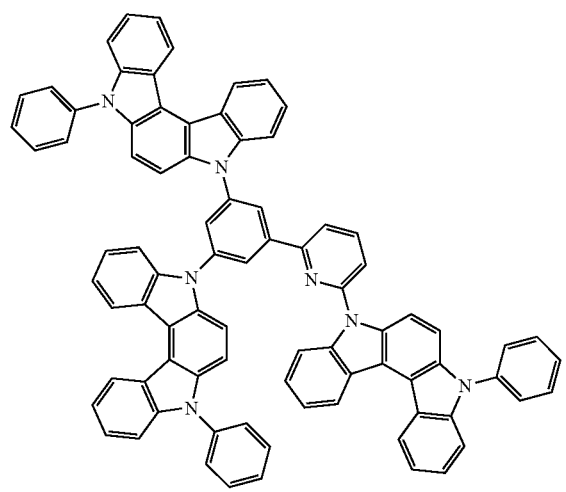
5-17
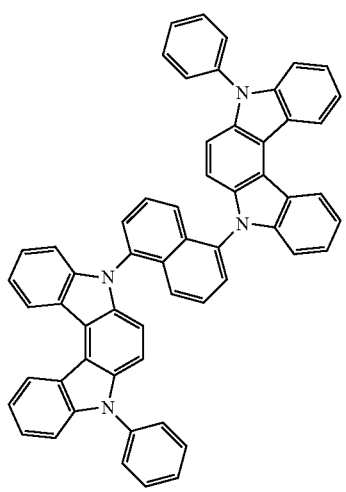

-continued
| 5-18 | 5-19 |
|---|---|
| 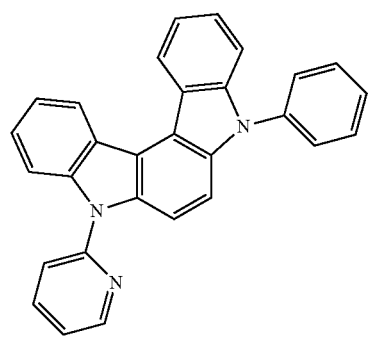 | 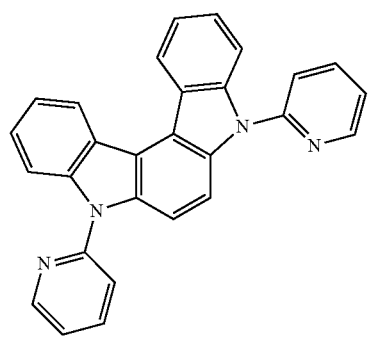 |
| 5-20 | 5-21 |
| 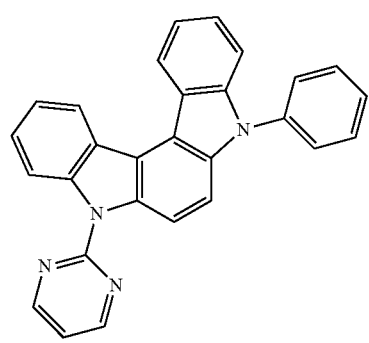 | 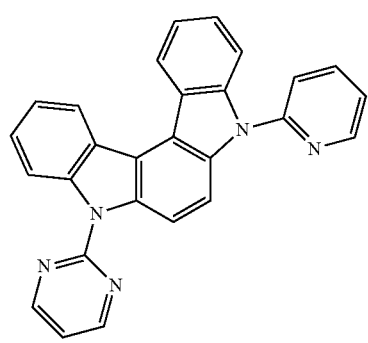 |
| 5-22 | 5-23 |
| 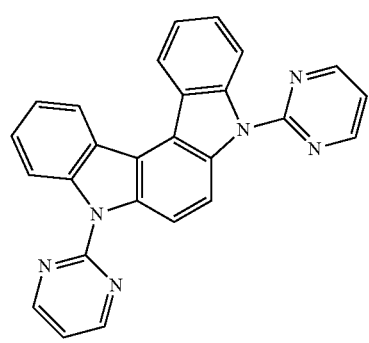 | 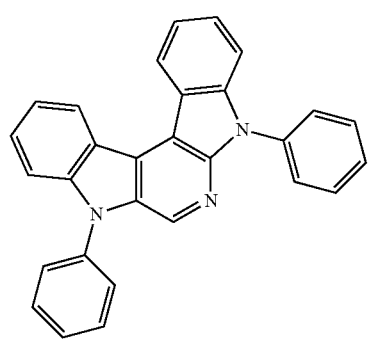 |
| 6-1 | 6-2 |
| 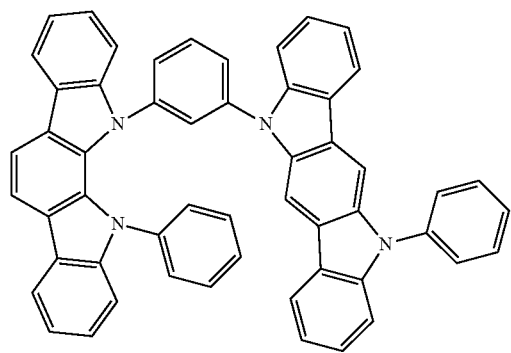 | 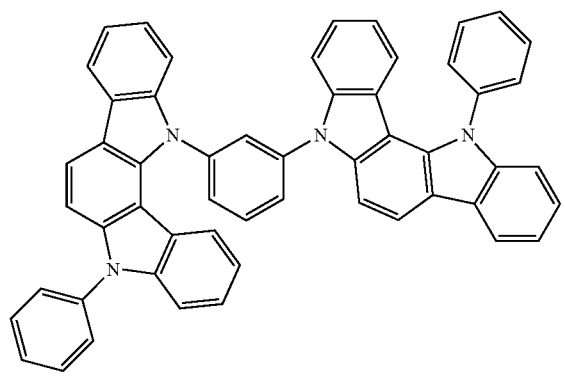 |

-continued
6-3
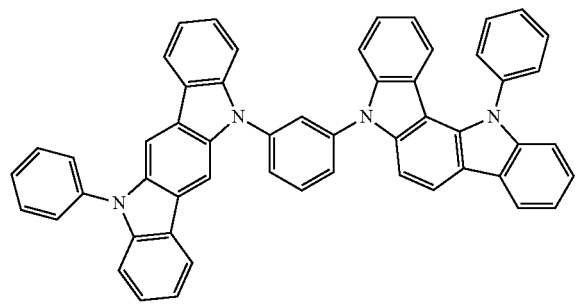
6-4
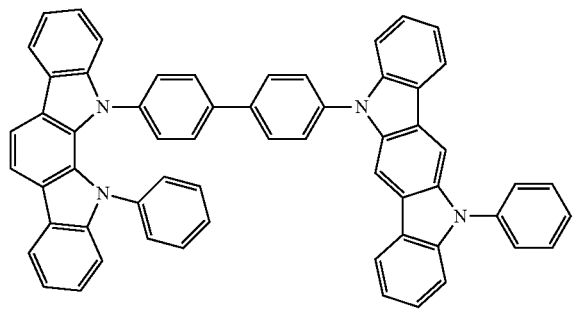
6-5
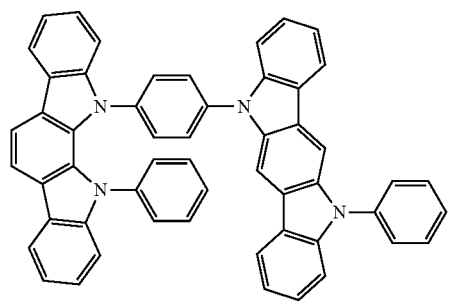
6-6
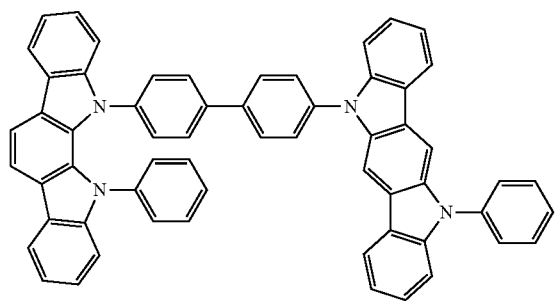
6-7
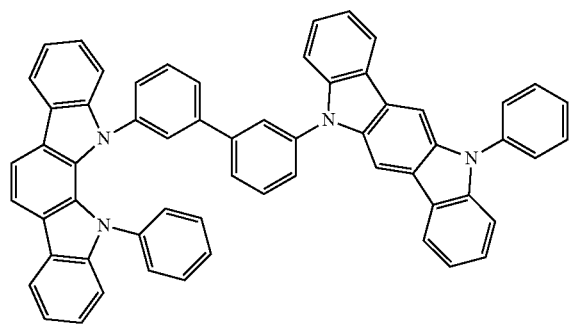
6-8
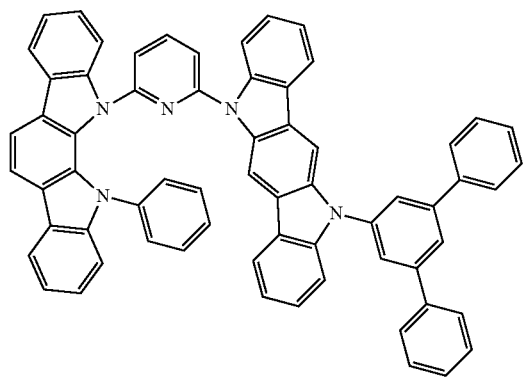
6-9
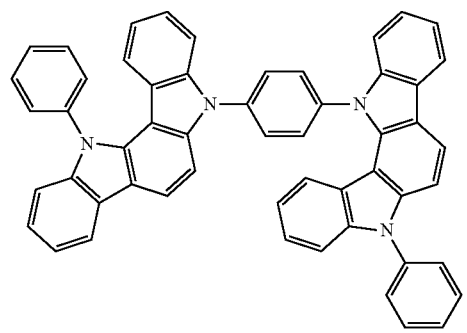
6-10
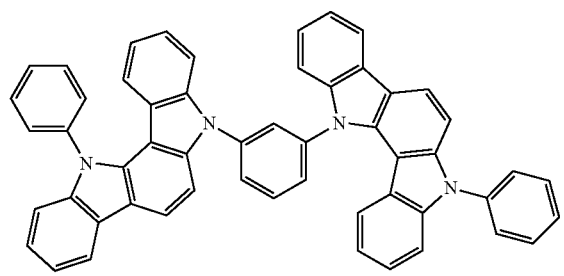

-continued
6-11
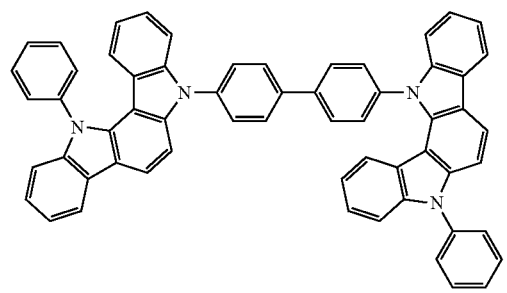
6-12
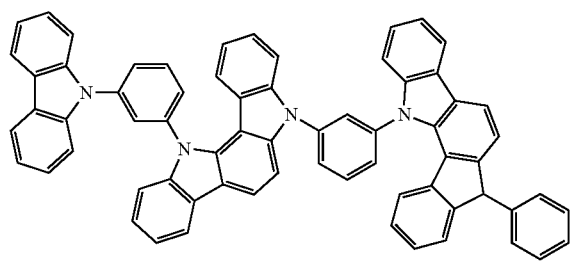
6-13
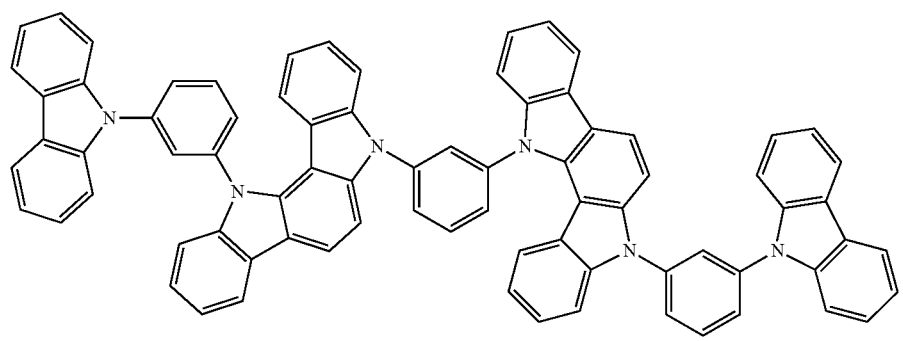
6-14
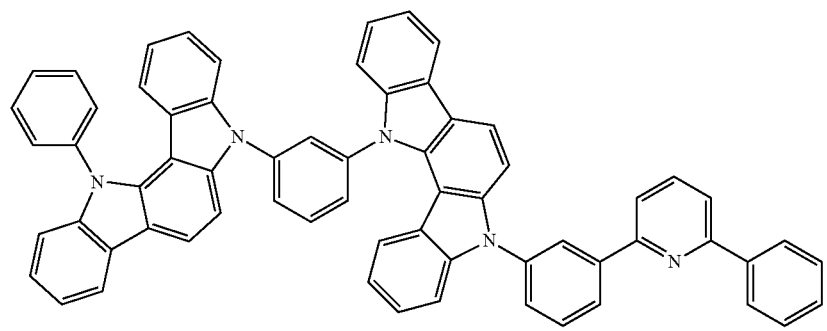
6-15
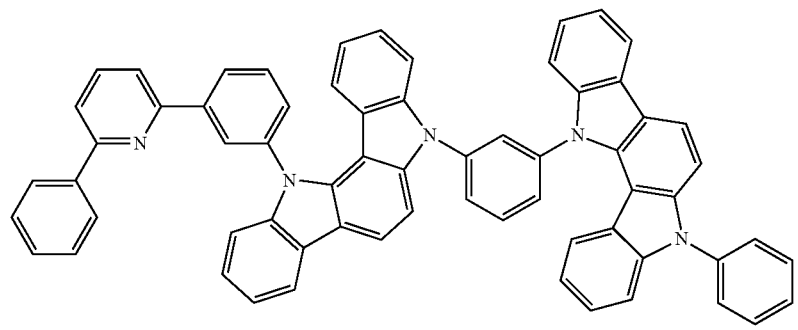

6-16
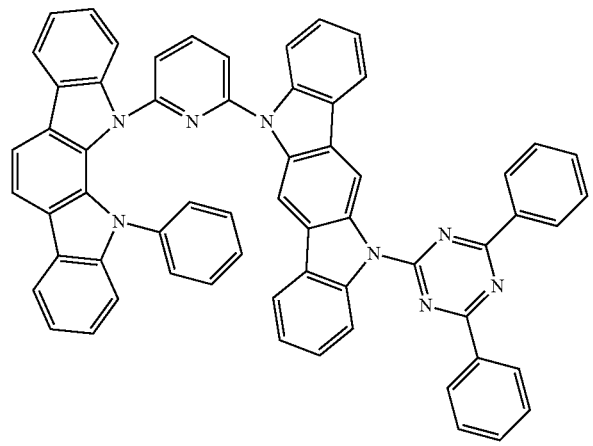
6-17
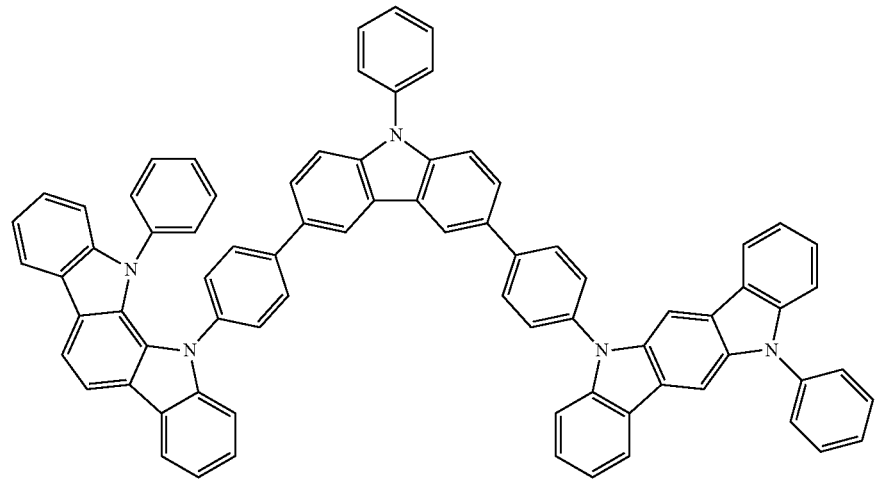
6-18
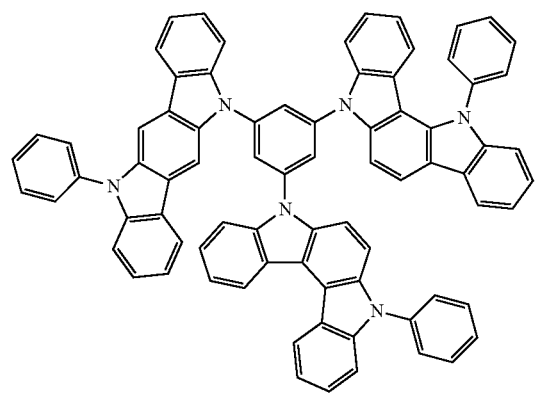
6-19
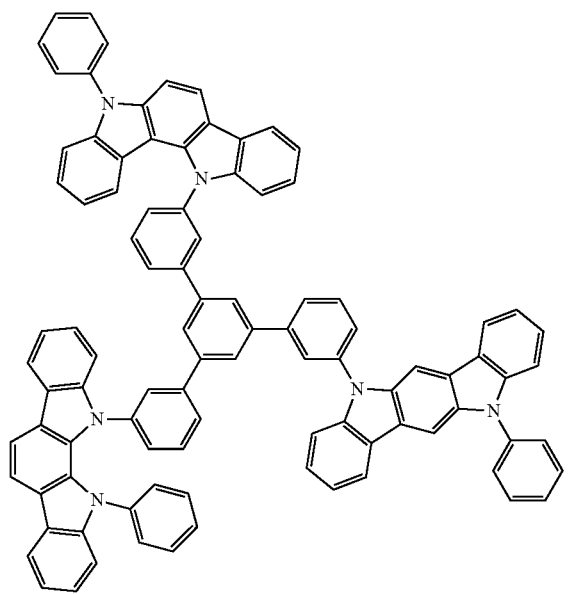

The organic EL device of the present invention includes an anode, a cathode, and organic layers including a hole-transporting layer and a light-emitting layer, the organic layers being interposed between the anode and the cathode, in which the light-emitting layer contains a phosphorescent light-emitting material, and the hole-transporting layer and the light-emitting layer has an EB layer therebetween, the EB layer being adjacent to the light-emitting layer and containing an indolocarbazole compound represented by the general formula (1).

Here, it is known that some compounds included in the indolocarbazole compounds each represented by the general formula (1) are used as hole-transporting materials for the hole-transporting layer and host materials for the light-emitting layer. In the present invention, however, the above-mentioned EB layer is provided between the hole-transporting layer and the light-emitting layer. In addition, as a material used for the hole-transporting layer to be provided separately from the EB layer, used is a hole-transporting material having a HOMO energy higher than the HOMO energy of the indolocarbazole compound used for the EB layer, and preferably used is a hole-transporting material other than the indolocarbazole compound.

It is preferred that one of the adjacent layers to the EB layer be a light-emitting layer, and the other one be a hole-transporting layer or a layer including a hole-transporting material. Here, the layer including a hole-transporting material arranged between the EB layer and the anode also functions as a hole-transporting layer, and as used herein, this layer is also referred to as hole-transporting layer. Thus, the hole-transporting layer may be provided in one layer or two or more layers.

It is preferred that the LUMO energy of the indolocarbazole compound contained in the EB layer be higher than the LUMO energy of a compound included in the adjacent light-emitting layer. When the adjacent light-emitting layer includes a plurality of compounds, it is preferred that the LUMO energy of the indolocarbazole compound contained in the EB layer be higher than the LUMO energy of a compound serving as a main component of the plurality of compounds. It is preferred that the LUMO energy of the indolocarbazole compound be higher than the LUMO energy of the compound (main component) included in the light-emitting layer by 0.1 eV or more, preferably 0.3 eV or more, more preferably 0.5 eV or more.

The LUMO energy of the indolocarbazole compound is preferably −1.2 eV or more, more preferably −1.0 eV or more, most preferably −0.9 eV or more.

Further, it is preferred that the HOMO energy of the hole-transporting material contained in the hole-transporting layer be higher than the HOMO energy of the indolocarbazole compound represented by the above-mentioned general formula (1). Further, the HOMO energy of the hole-transporting material adjacent to the anode or the hole-injecting layer is preferably −4.8 eV or more, but is not particularly limited thereto.

A preferred form of the organic EL device of the present invention is one in which the light-emitting layer contains at least one phosphorescent light-emitting material and at least one electron-transporting host material. In this case, electrons flowing through the light-emitting layer are efficiently blocked by the EBL, and the leakage of electrons to the hole-transporting layer is reduced. This leads to an improvement in probability of recombination of holes and electrons in the light-emitting layer and an improvement in luminous efficiency of the phosphorescent light-emitting material.

A more preferred form of the organic EL device has an electron-transporting layer between the cathode and the light-emitting layer in addition to the foregoing. A material used for the electron-transporting layer has an electron mobility of preferably $1 \times 10^{-7}$ cm$^2$/V·s or more, more preferably $1 \times 10^{-6}$ cm$^2$/V·s or more, most preferably $1 \times 10^{-5}$ cm$^2$/V·s or more.

It should be noted that values for the LUMO energy and HOMO energy as used herein are values determined using software for molecular orbital calculation, Gaussian03, manufactured by Gaussian, Inc., USA, and are defined as values calculated by structure optimization calculation at the B3LYP/6-31G* level.

Further, values for the electron mobility as used herein refer to values at an electric field of $E^{1/2}=500$ (V/cm)$^{1/2}$ measured by a time of fright (TOF) method.

Next, a structure of the organic EL device of the present invention is described with reference to the drawings. However, the structure of the organic EL device of the present invention is by no means limited to one shown in the figure.

FIG. 1 is a cross-sectional view schematically showing a structure example of a general organic EL device to be used in the present invention. In the figure, a substrate is represented by 1, an anode is represented by 2, a hole-injecting layer is represented by 3, a hole-transporting layer is represented by 4, an EB layer is represented by 5, a light-emitting layer is represented by 6, an electron-transporting layer is represented by 7, and a cathode is represented by 8. The organic EL device of the present invention has, as essential layers, an anode, a hole-transporting layer, an EB layer, a light-emitting layer, and a cathode. Advantageously, the organic EL device has an anode, a hole-transporting layer, an EB layer, a light-emitting layer, an electron-transporting layer, and a cathode.

Further, the organic EL device of the present invention may have, as layers other than the essential layers, an electron-transporting layer, an electron-injecting layer, and a hole-blocking layer. In addition, the hole-transporting layer may be a hole-injecting/transporting layer having a hole-injecting function and the electron-transporting layer may be an electron-injecting/transporting layer having an electron-injecting function.

It should be noted that the organic EL device of the present invention may have an structure opposite to that shown in FIG. 1, that is, the cathode 8, the electron-transporting layer 7, the light-emitting layer 6, the EB layer 5, the hole-transporting layer 4, and the anode 2 may be laminated on the substrate 1 in the stated order. Also in this case, a layer may be added or omitted, as necessary.

Hereinafter, the respective members and the respective layers are described.

Substrate

The organic EL device of the present invention is preferably supported by a substrate. The substrate is not particularly limited and may be any substrate which is conventionally used in an organic EL device. For example, a substrate formed of glass, transparent plastic, quartz, or the like may be used.

Anode

Preferably used as the anode in the organic EL device is one using, as an electrode substance, any of a metal, an alloy, an electrically conductive compound, and a mixture thereof with a high work function (4 eV or more). Specific examples of such electrode substance include metals such as Au and conductive transparent materials such as CuI, indium tin oxide (ITO), SnO$_2$, and ZnO. Further, a material capable of producing an amorphous transparent conductive film such as IDIXO (In$_2$O$_3$—ZnO) may be used. In the production of the anode, it is possible to form any of those electrode substances into a thin film by a method such as vapor deposition or sputtering, and then form a pattern having a desired shape by a photolithographic method. Alternatively, in the case of not requiring high pattern accuracy (about 100 μm or more), it is also possible to form a pattern via a mask having a desired shape during the vapor deposition or sputtering of any of the above-mentioned electrode substances. Alternatively, in the case of using a coatable substance such as an organic conductive compound, it is also possible to employ a wet film-forming method of a printing mode, a coating mode, or the like. When emitted light is extracted from the anode, the transmittance is desirably set to more than 10%, and the sheet resistance as the anode is preferably several hundred Ω/□ or less. In addition, the film thickness, which varies depending on materials, is selected in the range of generally 10 to 1,000 nm, preferably 10 to 200 nm.

Cathode

Meanwhile, used as the cathode is one using, as an electrode substance, any of a metal (referred to as electron-injecting metal), an alloy, an electrically conductive compound, and a mixture thereof with a low work function (4 eV or less). Specific examples of such electrode substance include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal. Of those, from the viewpoints of electron-injecting property and durability against oxidation and the like, a mixture of an electron-injecting metal and a second metal, which has a work function value higher than that of the electron-injecting metal and is a stable metal, such as a magnesium/silver mixture, a magnesium/aluminum mixture, a magnesium/indium mixture, an aluminum/aluminum oxide ($Al_2O_3$) mixture, a lithium/aluminum mixture, or aluminum is suitable. The cathode may be produced by forming any of those electrode substances into a thin film by a method such as vapor deposition or sputtering. Further, the sheet resistance as the cathode is preferably several hundred Ω/□ or less, and the film thickness is selected in the range of generally 10 nm to 5 μm, preferably 50 to 200 nm. It should be noted that any one of the anode and the cathode of the organic EL device is transparent or translucent in order to transmit emitted light.

Further, when the conductive transparent material given in the description about the anode is used for the cathode, a transparent or translucent cathode may be produced. The application of this technique allows the production of a device in which both of the anode and the cathode each have transparency.

Light-Emitting Layer

The light-emitting layer is a phosphorescent light-emitting layer and includes a phosphorescent light-emitting material and a host material. The phosphorescent light-emitting material in the light-emitting layer preferably contains an organic metal complex including at least one metal selected from ruthenium, rhodium, palladium, silver, rhenium, osmium, iridium, platinum, and gold. Such organic metal complexes are known in the above-mentioned patent literatures and the like, and an organic metal complex may be selected therefrom and used.

Preferred examples of the phosphorescent light-emitting material include complexes such as Ir(ppy)3, complexes such as Ir(bt)2·acac3, and complexes such as PtOEt3, the complexes each having a noble metal element such as Ir as a central metal. Specific examples of the complexes are given below. However, the complexes are not limited to the following compounds.

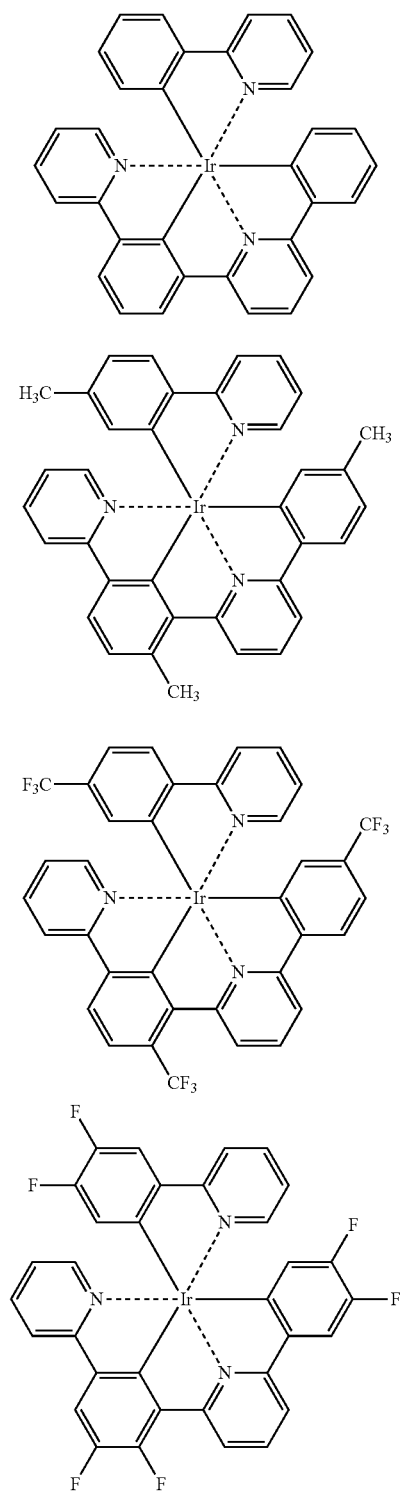

-continued
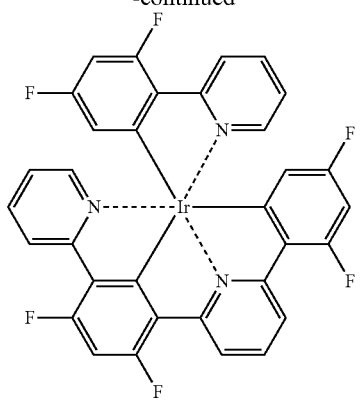
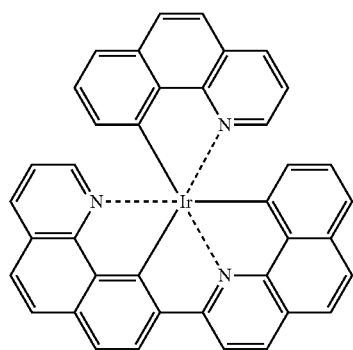
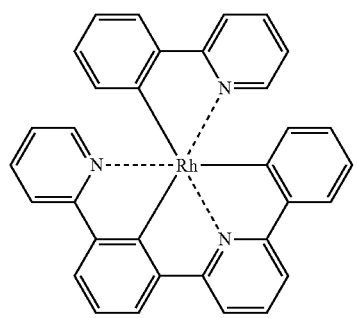
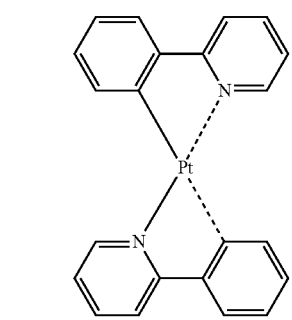
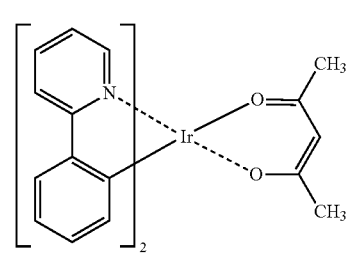
-continued
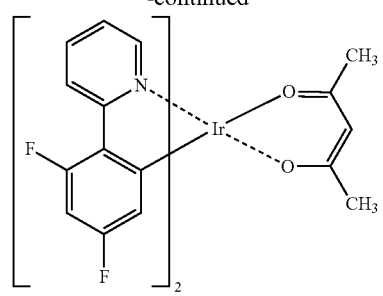
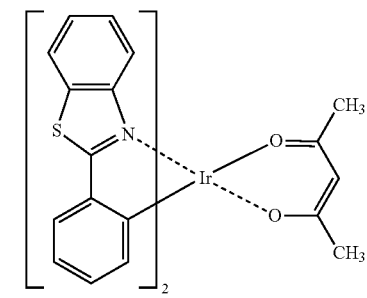
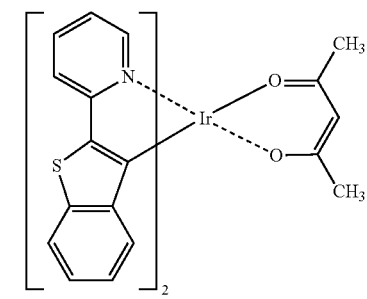
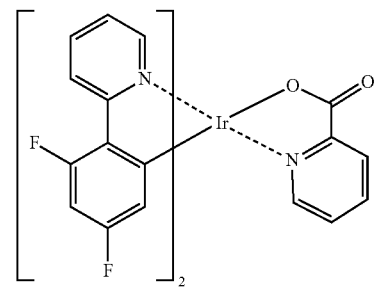
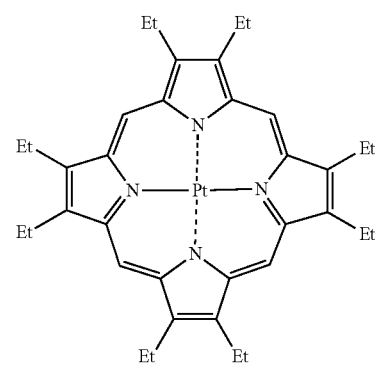

-continued

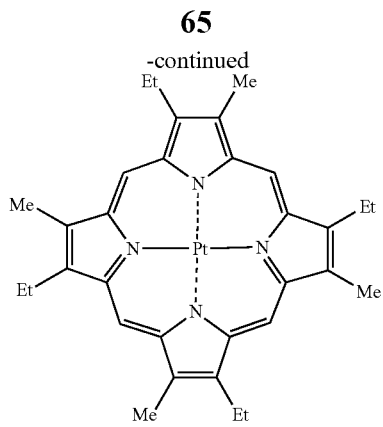

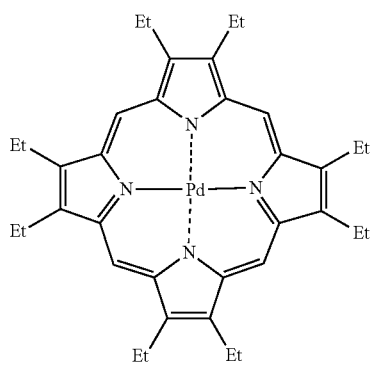

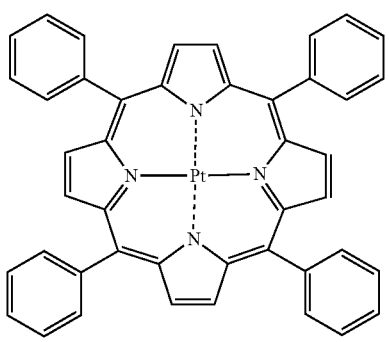

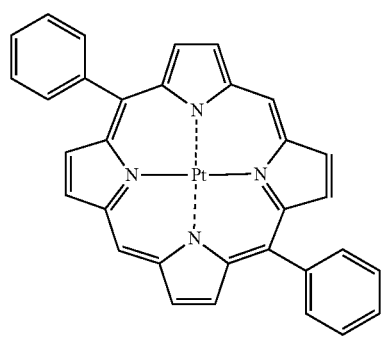

-continued

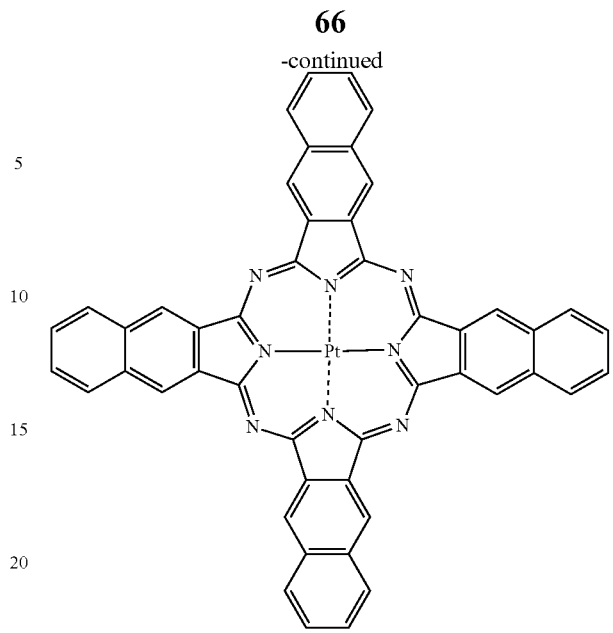

It is recommended that the amount of the phosphorescent light-emitting material contained in the light-emitting layer fall within the range of 1 to 20 wt %, preferably 5 to 10 wt %.

The host material in the light-emitting layer may be selected from host materials known in numerous patent literatures and the like. Specific examples of the host material, which are not particularly limited, include heterocyclic tetracarboxylic acid anhydrides of, for example, an indole derivative, a carbazole derivative, an indolocarbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne-based compound, a porphyrin-based compound, an anthraquinodimethane derivative, an anthrone derivative, a diphenylquinone derivative, a thiopyran dioxide derivative, and naphthaleneperylene, various kinds of metal complexes typified by metal complexes of a phthalocyanine derivative and an 8-quinolinol derivative, metal phthalocyanine, and metal complexes of benzoxazole and a benzothiazole derivative, and polymer compounds such as a polysilane-based compound, a poly(N-vinylcarbazole) derivative, an aniline-based copolymer, a thiophene oligomer, a polythiophene derivative, a polyphenylene derivative, a polyphenylenevinylene derivative, and a polyfluorene derivative. The above-mentioned host material is preferably a compound that prevents the wavelength of emitted light from shifting to the long-wavelength side and has a high glass transition temperature. The host material as used herein is defined as a material that emits no phosphorescent light during the driving of an organic EL device.

In general, the host material has an ability to transport both charges of holes and electrons. In particular, a material excellent in hole-transporting performance is referred to as hole-transporting host material, and a material excellent in electron-transporting ability is referred to as electron-transporting host material.

In the organic EL device of the present invention, it is preferred to use an electron-transporting host material. The electron-transporting host material as used herein is defined as a host material having an electron mobility higher than a hole transfer rate, or a host material having an electron transfer rate of $1\times10^{-7}$ cm$^2$/V·s or more. In particular, it is preferred that the electron-transporting host material have an electron transfer rate of $1\times10^{-6}$ cm$^2$/V·s or more.

Specific examples of the electron-transporting host material include heterocyclic tetracarboxylic acid anhydrides of, for example, a carbazole derivative, an indolocarbazole derivative, pyridine, pyrimidine, triazine, an imidazole derivative, pyrrazole, a triazole derivative, an oxazole derivative, an oxadiazole derivative, a fluorenone derivative, an anthraquinodimethane derivative, an anthrone derivative, a diphenylquinone derivative, thiopyran dioxide, carbodiimide, fluorenylidenemethane, distyrylpyrazine, a fluorine-substituted aromatic compound, and naphthaleneperylene, various kinds of metal complexes typified by metal complexes of a phthalocyanine derivative and an 8-quinolinol derivative, metal phthalocyanine, and metal complexes each using benzoxazole or benzothiazole as a ligand.

Injecting Layer

The injecting layer refers to a layer to be provided between an electrode and an organic layer for the purposes of reducing a driving voltage and improving a light emission luminance. The injecting layer includes a hole-injecting layer and an electron-injecting layer, and may be provided between the anode and the light-emitting layer or the hole-transporting layer, and between the cathode and the light-emitting layer or the electron-transporting layer. The injecting layer may be provided as necessary.

Blocking Layer

The blocking layer is capable of blocking charges (electrons or holes) and/or excitons present in the light-emitting layer from diffusing to the outside of the light-emitting layer. The electron-blocking layer may be arranged between the light-emitting layer and the hole-transporting layer, and blocks electrons from passing through the light-emitting layer toward the hole-transporting layer. Similarly, the hole-blocking layer may be arranged between the light-emitting layer and the electron-transporting layer, and blocks holes from passing through the light-emitting layer toward the electron-transporting layer. The blocking layer may also be used for blocking excitons from diffusing to the outside of the light-emitting layer. That is, the electron-blocking layer and the hole-blocking layer may each have a function of an exciton-blocking layer as well. The EB layer as used herein is meant to include a layer having a function of an electron-blocking layer and/or an exciton-blocking layer in one layer.

Hole-Blocking Layer

The hole-blocking layer has a role in blocking holes from reaching the electron-transporting layer while transporting electrons. This can improve the probability of recombination of electrons and holes in the light-emitting layer. A material for the hole-blocking layer is exemplified by an aluminum metal complex, a styryl derivative, a triazole derivative, a phenanthroline derivative, an oxadiazole derivative, or a boron derivative.

Electron-Blocking Layer

An electron-blocking layer has a role in blocking electrons from reaching the hole-transporting layer while transporting holes. This can improve the probability of recombination of electrons and holes in the light-emitting layer.

As a material for the electron-blocking layer, the indolocarbazole compound represented by the general formula (1) is preferably used.

Exciton-Blocking Layer

The exciton-blocking layer refers to a layer for blocking excitons, which are generated by the recombination of holes and electrons in the light-emitting layer, from diffusing to a charge-transporting layer. The insertion of this layer allows excitons to be efficiently confined in the light-emitting layer, which can improve the luminous efficiency of a device. The exciton-blocking layer may be inserted on any of the anode side and the cathode side of the adjacent light-emitting layer, and may be simultaneously inserted on both of the sides. That is, when the exciton-blocking layer is provided on the anode side, the layer may be inserted between the hole-transporting layer and the light-emitting layer so as to be adjacent to the light-emitting layer. When the exciton-blocking layer is inserted on the cathode side, the layer may be inserted between the light-emitting layer and the cathode so as to be adjacent to the light-emitting layer. Further, the hole-injecting layer, the electron-blocking layer, and the like may be provided between the anode and the exciton-blocking layer adjacent to the anode side of the light-emitting layer, and the electron-injecting layer, the electron-transporting layer, the hole-blocking layer, and the like may be provided between the cathode and the exciton-blocking layer adjacent to the cathode side of the light-emitting layer.

The EB layer according to the present invention functions as an electron-blocking layer and/or an exciton-blocking layer. Hence, it is advantageous not to provide the electron-blocking layer and the exciton-blocking layer in addition the EB layer between the light-emitting layer and the anode. It should be noted that the layers may be provided between the light-emitting layer and the cathode, as necessary. The EB layer has a thickness of preferably 3 to 100 nm, more preferably 5 to 30 nm.

As a material for the exciton-blocking layer, the indolocarbazole compound represented by the general formula (1) is preferably used, and the derivative is more preferably used in the exciton-blocking layer on the anode side. Alternatively, other known exciton-blocking materials may also be used.

An applicable known material for an exciton-blocking layer is exemplified by 1,3-dicarbazolylbenzene (mCP) or bis(2-methyl-8-quinolinolato)-4-phenylphenolatoaluminum (III) (BAlq).

Hole-Transporting Layer

The hole-transporting layer is formed of a hole-transporting material having a function of transporting holes. The hole-transporting layer may be provided in a single layer or a plurality of layers. The hole-transporting layer is provided between the EB layer and the anode and contains a hole-transporting material. It is preferred that the hole-transporting layer be adjacent to the anode or the hole-injecting layer.

The hole-transporting material has a function of transporting holes and may have a function of injecting holes as well. The hole-transporting material may be an organic material or an inorganic material. An applicable known hole-transporting material is exemplified by a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, or a conducting polymeric oligomer, particularly a thiophene oligomer. However, preferably used are a porphyrin compound, an aromatic tertiary amine compound, and a styrylamine compound, and more preferably used is an aromatic tertiary amine compound.

The indolocarbazole compound contained in the EB layer is also one kind of the hole-transporting material. When a layer containing the compound is arranged on the light-emitting layer side separately from the hole-transporting layer, the layer functions as an EB layer.

Although there is known an organic EL device using two or more hole-transporting layers, there is not known any example in which an indolocarbazole compound is arranged and used at the same position as that of the EB layer in the organic EL device of the present invention. In addition, when the above-mentioned EB layer is provided, an unprecedented remarkable effect is exhibited. The EB layer exhibiting such excellent effect is estimated to have a high LUMO energy to give an excellent electron-blocking effect, and have a moderate HOMO energy and a hole-transporting ability to prevent electrons and excitons from leaking from the light-emitting layer, thereby providing stable and satisfactory device characteristics. Even in the situation in which numerous hole-transporting materials are known, a compound for an EB layer, which provides such satisfactory device characteristics, has not been known heretofore, and has been found by the inventors of the present invention for the first time. It should be noted that in the case where the above-mentioned indolocarbazole compound is incorporated into a general hole-transporting layer, when the hole-transporting layer is a single layer, the HOMO energy is not matched, with the result that the driving voltage shifts to a high voltage and the life tends to be shortened.

Electron-Transporting Layer

The electron-transporting layer is formed of a material having a function of transporting electrons. The electron-transporting layer may be provided in a single layer or a plurality of layers.

An electron-transporting material has only to have a function of transporting electrons, which are injected from the cathode, to the light-emitting layer. An applicable electron-transporting layer is exemplified by an aluminum complex typified by Alq3, a nitro-substituted fluorene derivative, a diphenylquinone derivative, a thiopyran dioxide derivative, carbodiimide, a fluorenylidenemethane derivative, an anthraquinodimethane derivative, an anthrone derivative, or an oxadiazole derivative. In addition, in the above-mentioned oxadiazole derivative, a thiadiazole derivative in which an oxygen atom of an oxadiazole ring is substituted by a sulfur atom, or a quinoxaline derivative having a quinoxaline ring known as an electron-withdrawing group may also be used as the electron-transporting material. Further, a phosphorus-containing derivative and a silicon-containing derivative have high electron transfer rates and hence are preferred electron-transporting materials. In addition, a polymer material obtained by introducing any of those materials into a polymer chain, or a polymer material including any of those materials in a polymer main chain may also be used.

EB Layer

The EB layer is a layer having functions of both of the electron-blocking layer and the exciton-blocking layer, and contains an indolocarbazole compound represented by the general formula (1).

The organic EL device of the present invention may be any of a single device, a device formed of a structure with arrangement in an array fashion, and a structure in which an anode and a cathode are arranged in an X-Y matrix fashion. In the organic EL device of the present invention, the provision of the EB layer between the hole-transporting layer and the phosphorescent light-emitting layer so as to be adjacent to the light-emitting layer allows blocking electrons and/or excitons from leaking from the light-emitting layer to the hole-transporting layer. Thus, a device having high luminous efficiency and greatly improved driving stability as compared to a conventional device is obtained.

EXAMPLES

Hereinafter, the present invention is described in more detail by way of examples. However, it should be understood that the present invention is by no means limited to these examples and can be carried out in various forms without departing from the gist of the present invention.

Hereinafter, synthesis examples of compounds of the present invention are described. It should be noted that the numbers of the compounds correspond to the numbers given to the above-mentioned chemical formulae.

Synthesis Example 1

Synthesis of Compound 1-1

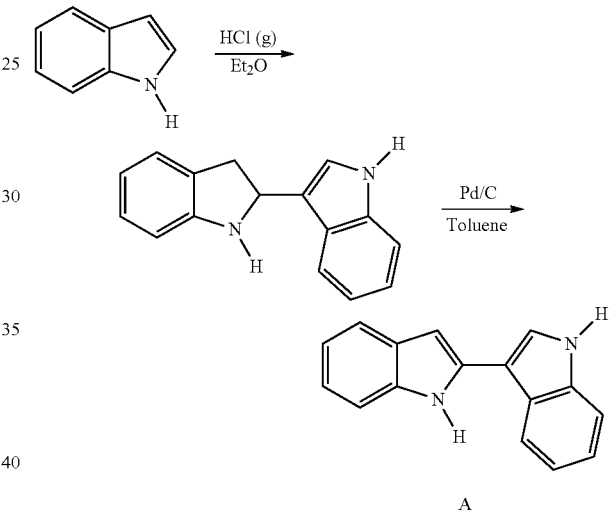

Under a nitrogen atmosphere, a hydrogen chloride gas generated by adding 112.0 g (1.10 mol) of concentrated hydrochloric acid dropwise over 1 hour to 211.7 g (2.16 mol) of concentrated sulfuric acid was blown into a solution of 20.0 g (0.17 mol) of indole in 300 ml of dry diethyl ether with stirring at room temperature. The reaction solution was stirred at room temperature for 15 hours. After that, 121.0 g of ethyl acetate and 303.2 g of a saturated sodium hydrogen carbonate aqueous solution were added. The aqueous layer was extracted with ethyl acetate (2×100 ml). The organic layer was then washed with a saturated sodium hydrogen carbonate aqueous solution (100 ml) and distilled water (2×100 ml). The organic layer was dried over anhydrous magnesium sulfate. After that, the magnesium sulfate was separated by filtration and the solvent was subjected to vacuum distillation. The resultant residue was dissolved in 150 ml of toluene, and 2.5 g of palladium/active carbon were added. The mixture was then stirred for 3 hours while being refluxed by heating at 111° C. The reaction solution was cooled to room temperature. After that, the palladium/active carbon was separated by filtration and the solvent was subjected to vacuum distillation. The residue was subjected to purification by recrystallization to afford 14.7 g (37 yield) of an intermediate A as a white crystal.

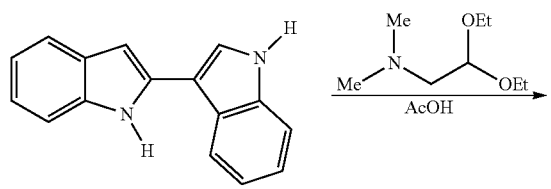

A

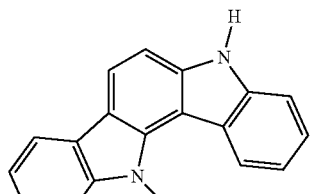

B

Under a nitrogen atmosphere, 14.1 g (0.061 mol) of the intermediate A, 11.4 g (0.071 mol) of N,N-dimethylaminoacetaldehyde diethyl acetal, and 110.0 g of acetic acid were stirred for 8 hours while being refluxed by heating at 118° C. The reaction solution was cooled to room temperature. After that, the precipitated crystal was collected by filtration and washed with acetic acid (30 ml). The resultant crystal was subjected to purification by reslurrying to afford 10.4 g of an intermediate B (67% yield) as a white crystal.

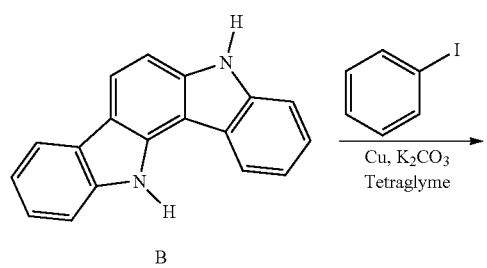

B

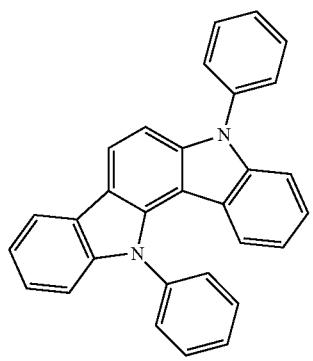

1-1

Under a nitrogen atmosphere, 10.0 g (0.039 mol) of the intermediate B, 79.6 g (0.39 mol) of iodobenzene, 12.4 g (0.20 mol) of copper, 16.2 g (0.12 mol) of potassium carbonate, and 200 ml of tetraglyme were stirred for 72 hours while being heated at 190° C. The reaction solution was cooled to room temperature, and inorganic matter was separated by filtration. After that, while the solution was stirred, distilled water (200 ml) was added thereto, and the precipitated crystal was collected by filtration. The collected crystal was subjected to purification by silica gel column chromatography to afford 10.0 g (65% yield) of Compound 1-1 as a white solid.

Figure 2:
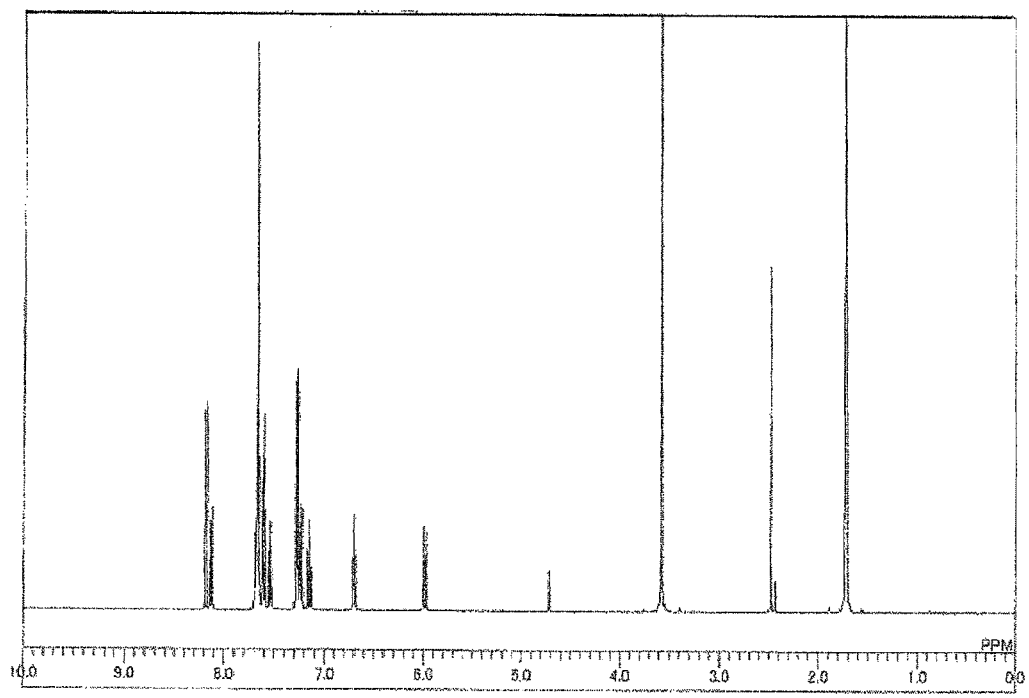
FIG. 2 shows a $^1$H-NMR chart of Compound 1-1.

Melting point: 176° C., APCI-TOFMS: m/z 409 [M+H]$^+$.
FIG. 2 shows $^1$H-NMR measurement results (measurement solvent: THF-d8).

Synthesis Example 2

Synthesis of Compound 2-1

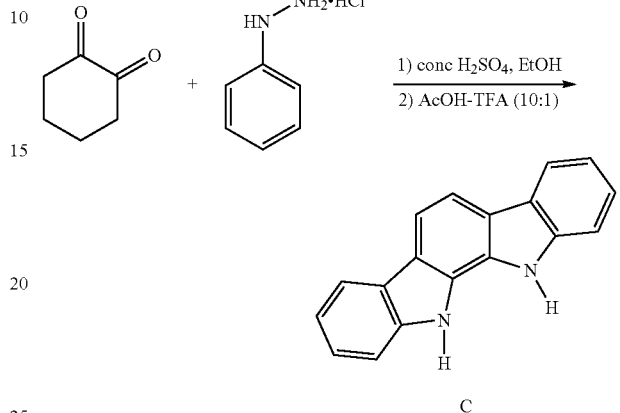

C

Under a nitrogen atmosphere, 3.0 g (0.031 mol) of concentrated sulfuric acid were added dropwise over 5 minutes to 33.3 g (0.30 mol) of 1,2-cyclohexanedione, 86.0 g (0.60 mol) of phenylhydrazine hydrochloride, and 1,000 ml of ethanol with stirring at room temperature. After that, the mixture was stirred for 4 hours while being heated at 65° C. The reaction solution was cooled to room temperature. After that, the precipitated crystal was collected by filtration and washed with ethanol (2×500 ml) to afford 80.0 g of a purplish brown crystal. 72.0 g (0.26 mol) of the crystal, 72.0 g of trifluoroacetic acid, and 720.0 g of acetic acid were stirred for 15 hours while being heated at 100° C. The reaction solution was cooled to room temperature. After that, the precipitated crystal was collected by filtration and washed with acetic acid (200 ml). The resultant crystal was subjected to purification by reslurrying to afford 30.0 g of an intermediate C (45% yield) as a white crystal.

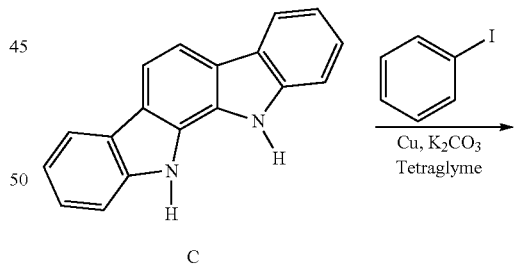

C

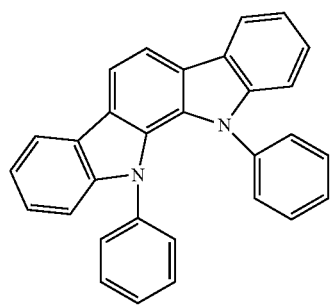

2-1

Figure 3:
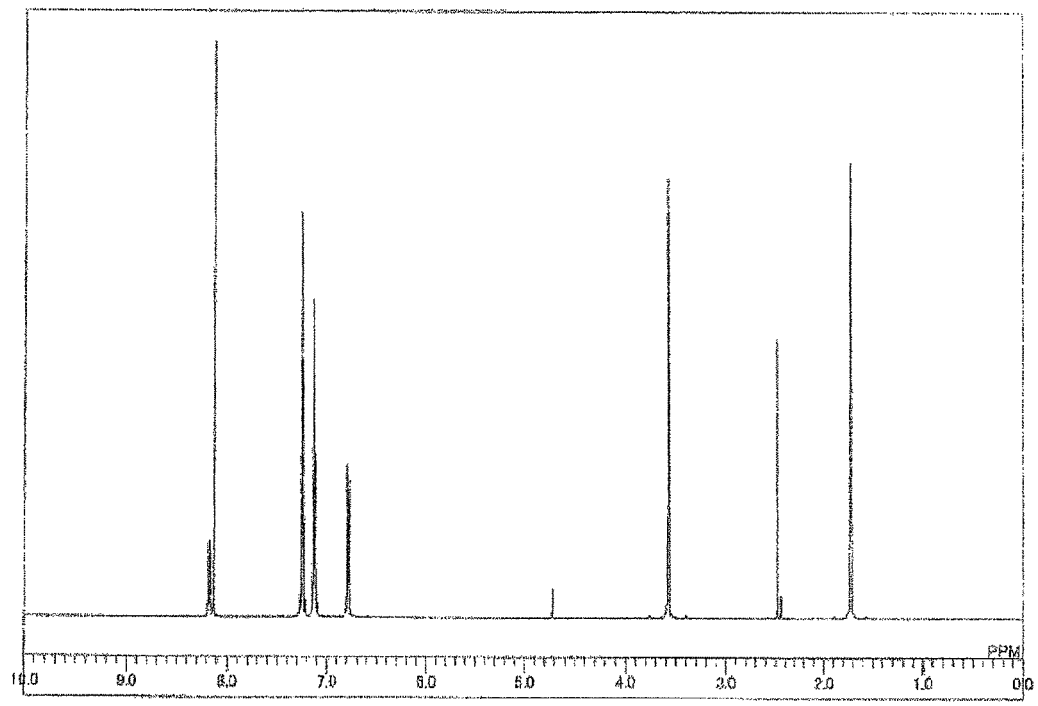
FIG. 3 shows a $^1$H-NMR chart of Compound 2-1.

Under a nitrogen atmosphere, 10.0 g (0.039 mol) of the intermediate C, 79.6 g (0.39 mol) of iodobenzene, 12.4 g (0.20 mol) of copper, 21.6 g (0.16 mol) of potassium carbonate, and 200 ml of tetraglyme were stirred for 120 hours while being heated at 190° C. The reaction solution was cooled to room temperature, and inorganic matter was separated by filtration. After that, while the solution was stirred, distilled water (200 ml) was added thereto, and the precipitated crystal was collected by filtration. The collected crystal was subjected to purification by silica gel column chromatography to afford 9.6 g (60% yield) of Compound 2-1 as a white solid. Melting point: 263° C., APCI-TOFMS: m/z 409 [M+H]$^+$. FIG. 3 shows $^1$H-NMR measurement results (measurement solvent: THF-d8).

Synthesis Example 3

Synthesis of Compound 3-1

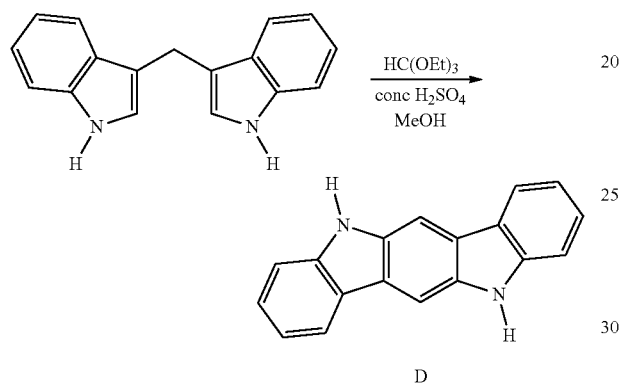

Under a nitrogen atmosphere, 5.0 g (0.052 mol) of concentrated sulfuric acid were added dropwise over 3 minutes to 50.69 g (0.21 mol) of 3,3'-methylenediindole, 30.55 g (0.21 mol) of triethyl orthoformate, and 640 g of methanol with stirring at room temperature. After that, the mixture was stirred for 1 hour while being refluxed by heating at 65° C. The reaction solution was cooled to room temperature. After that, the precipitated crystal was collected by filtration and washed with methanol to afford 36.81 g (70% yield) of an intermediate D as a reddish brown crystal.

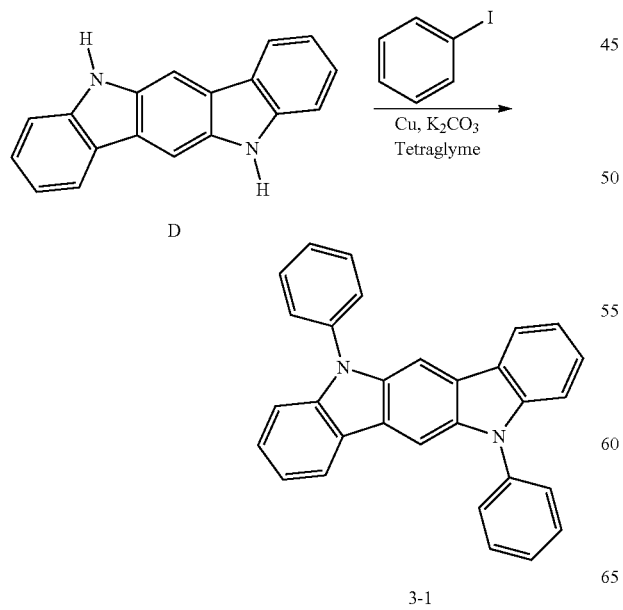

Figure 4:
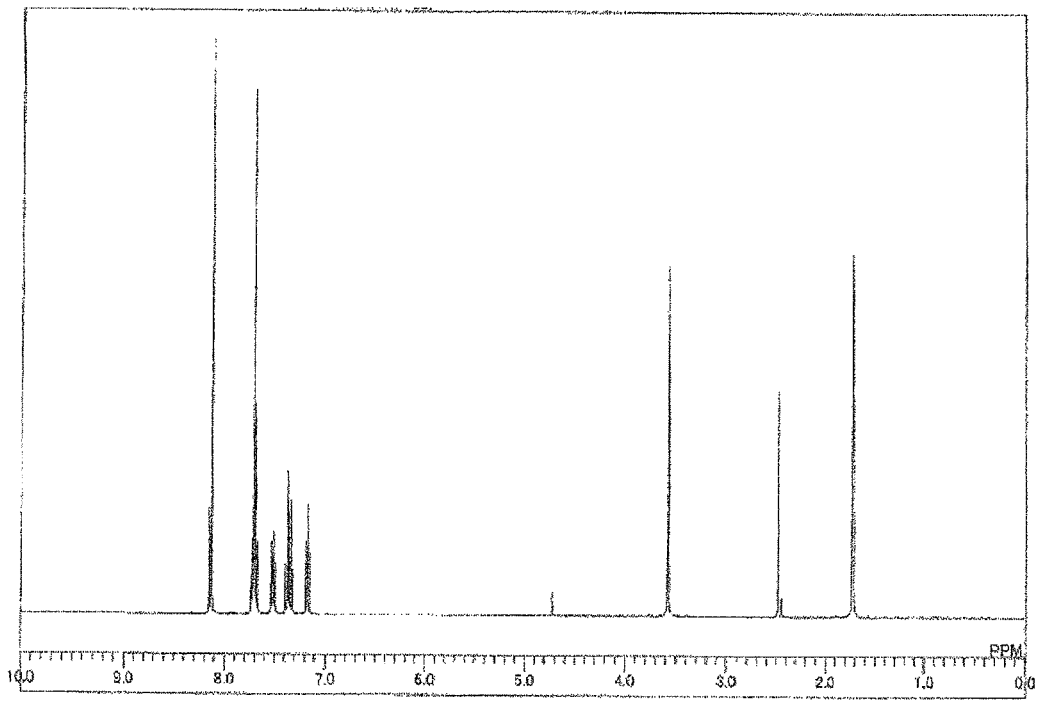
FIG. 4 shows a $^1$H-NMR chart of Compound 3-1.

Under a nitrogen atmosphere, 10.0 g (0.039 mol) of the intermediate D, 39.8 g (0.20 mol) of iodobenzene, 12.4 g (0.20 mol) of copper, 21.6 g (0.16 mol) of potassium carbonate, and 200 ml of tetraglyme were stirred for 72 hours while being heated at 190° C. The reaction solution was cooled to room temperature, and inorganic matter was separated by filtration. After that, while the solution was stirred, distilled water (200 ml) was added thereto, and the precipitated crystal was collected by filtration. The collected crystal was subjected to purification by silica gel column chromatography to afford 11.9 g (75% yield) of Compound 3-1 as a white solid. Melting point: 309° C., APCI-TOFMS: m/z 409 [M+H]$^+$. FIG. 4 shows $^1$H-NMR measurement results (measurement solvent: THF-d8).

Hereinafter, the respective materials used for the organic EL devices in Examples are described.

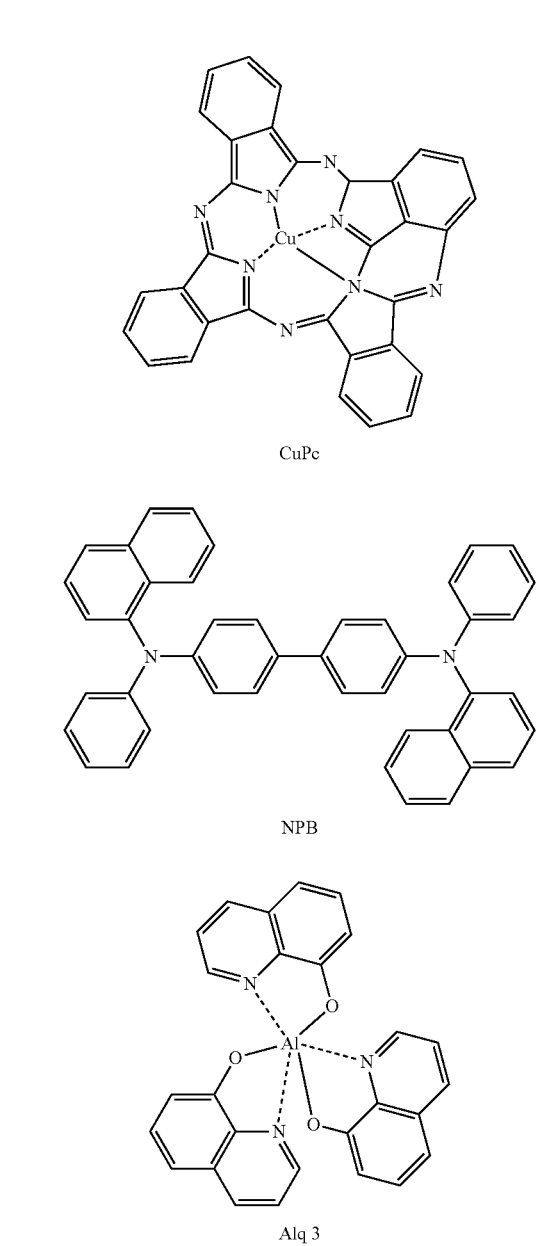

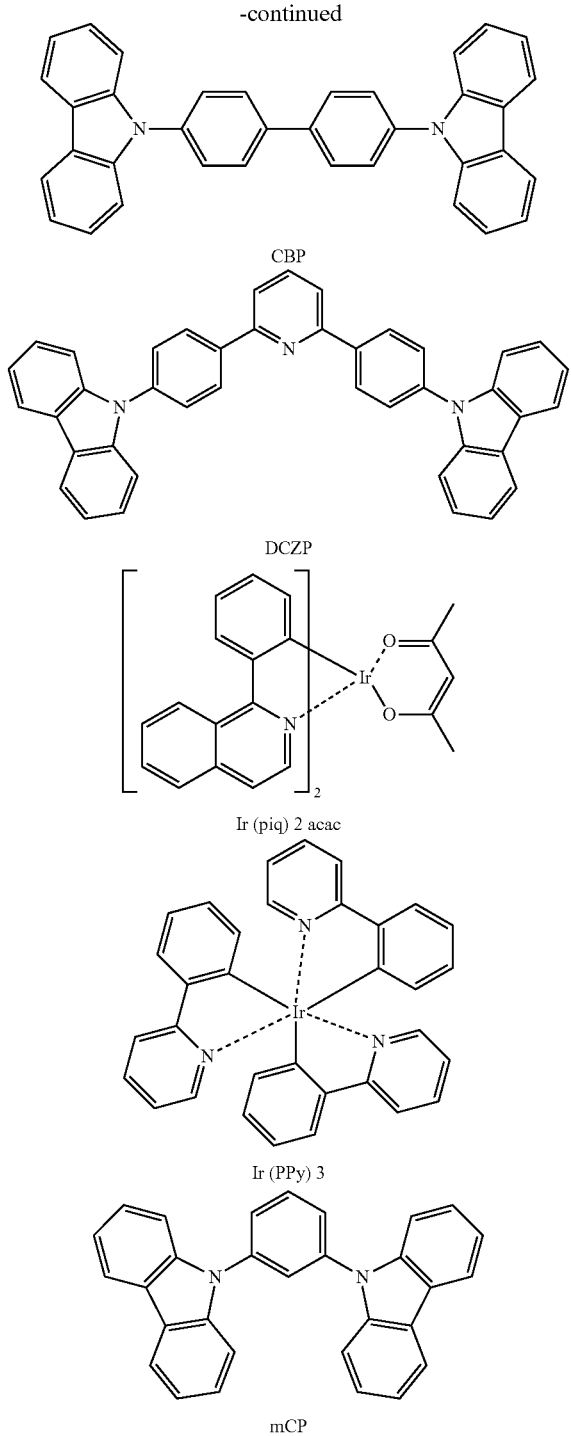

Shown below are the electron transfer rates of 2,6-di(4-carbazolylphenyl)pyridine (DCZP) and Alq3 measured by a time of fright (TOF) method. It should be noted that DCZP is used as a host material while Alq3 as an electron-transporting material.

The following values are values at an electric field of $E^{1/2}=500$ $(V/cm)^{1/2}$.

DCZP: $3\times10^{-6}$ cm$^2$/V·s

Alq3: $1\times10^{-6}$ cm$^2$/V·s

Table 1 shows LUMO energies of some of the compounds calculated by structure optimization calculation at the B3LYP/6-31G* level using Gaussian03.

TABLE 1

|  | LUMO energy (eV) |
| --- | --- |
| Compound 1-1 | −0.63 |
| Compound 2-1 | −0.85 |
| Compound 3-1 | −1.01 |
| Compound 1-7 | −0.77 |
| Compound 1-40 | −1.02 |
| Compound 2-12 | −0.98 |
| Compound 6-2 | −0.75 |
| DCZP | −1.44 |

Table 2 shows HOMO energies of some of the compounds calculated by structure optimization calculation at the B3LYP/6-31G* level using Gaussian03.

TABLE 2

|  | HOMO energy (eV) |
| --- | --- |
| Compound 1-1 | −4.98 |
| Compound 2-1 | −5.10 |
| Compound 3-1 | −4.84 |
| Compound 1-7 | −5.06 |
| Compound 1-40 | −5.00 |
| Compound 2-12 | −5.14 |
| Compound 6-2 | −5.04 |
| NPB | −4.71 |

Example 1

On a glass substrate, on which an anode being formed of ITO and having a thickness of 150 nm had been formed, the respective thin films were laminated at a degree of vacuum of $4.0\times10^{-4}$ Pa by a vacuum deposition method. First, CuPc was formed into a film having a thickness of 25 nm as a hole-injecting layer on ITO. Next, NPB was formed into a film having a thickness of 30 nm as a hole-transporting layer. Next, Compound 1-1 was formed into a film having a thickness of 10 nm as an EB layer on the hole-transporting layer. Next, DCZP and Ir(PPy)$_3$ were co-deposited from different deposition sources to form a film having a thickness of 40 nm as a light-emitting layer. In this case, the concentration of Ir(PPy)$_3$ was 6.0 wt %. Next, Alq3 was formed into a film having a thickness of 20 nm as an electron-transporting layer. In addition, lithium fluoride (LiF) was formed into a film having a thickness of 0.5 nm as an electron-injecting layer on the electron-transporting layer. Finally, aluminum (Al) was formed into a film having a thickness of 170 nm as an electrode on the electron-injecting layer. Thus, an organic EL device was produced.

The resultant organic EL device was connected to an exterior power source and applied with a DC voltage. As a result, the device was found to have a light emission characteristic as shown in Table 3. In Table 1, the luminance, voltage, and luminous efficiency are values obtained during the driving of the device at 2.5 mA/cm$^2$, and LT50 is a value obtained by evaluating the device by constant current driving at 20 mA/cm$^2$ and converting the evaluation result to one at an initial luminance of 1,000 cd/m$^2$. The maximum wavelength of the light emission spectrum of the device is 517 nm, showing that light emission is provided by Ir(PPy)$_3$.

Example 2

An organic EL device was produced in the same manner as in Example 1 except that Compound 2-1 was used in the ED layer in Example 1. The maximum wavelength of the light emission spectrum of the device is 517 nm, showing that light emission is provided by Ir(PPy)$_3$. Table 1 shows the resultant light emission characteristic.

Example 3

An organic EL device was produced in the same manner as in Example 1 except that Compound 3-1 was used in the EB layer in Example 1. The maximum wavelength of the light emission spectrum of the device is 517 nm, showing that light emission is provided by Ir(PPy)$_3$. Table 1 shows the resultant light emission characteristic.

Example 4

An organic EL device was produced in the same manner as in Example 1 except that Compound 1-7 was used in the EB layer in Example 1.

Example 5

An organic EL device was produced in the same manner as in Example 1 except that Compound 2-12 was used in the EB layer in Example 1.

Example 6

An organic EL device was produced in the same manner as in Example 1 except that Compound 6-2 was used in the EB layer in Example 1.

Comparative Example 1

An organic EL device was produced in the same manner as in Example 1 except that the film thickness of NPB serving as the hole-transporting layer was set to 40 nm and no electron-blocking layer was used in Example 1.

Comparative Example 2

An organic EL device was produced in the same manner as in Example 1 except that Compound 1-1 was used in the hole-transporting layer, the film thickness thereof was set to 40 nm, and no EB layer was used in Example 1.

Comparative Example 3

An organic EL device was produced in the same manner as in Example 1 except that mCP was used in the EB layer in Example 1.

The maximum wavelength of the light emission spectrum of the organic EL device obtained in any of Examples 1 to 6 and Comparative Examples 1 to 3 is 517 nm, showing that light emission is provided by Ir(PPy)$_3$. Table 3 shows the light emission characteristics.

TABLE 3

| | Hole-transporting layer | EB layer compound | Initial characteristics (@2.5 mA/cm$^2$) | | | Life characteristic (@1000 cd/m$^2$) LT50 [hr] |
|---|---|---|---|---|---|---|
| | | | Luminance [cd/m$^2$] | Voltage [V] | Luminous efficiency [lm/W] | |
| Example 1 | NPB | 1-1 | 1663 | 4.1 | 51.3 | 31400 |
| 2 | NPB | 2-1 | 1883 | 3.8 | 61.8 | 22300 |
| 3 | NPB | 3-1 | 843 | 4.0 | 26.8 | 18600 |
| 4 | NPB | 1-7 | 1759 | 3.6 | 62.1 | 35700 |
| 5 | NPB | 2-12 | 1745 | 4.2 | 52.2 | 39500 |
| 6 | NPB | 6-2 | 1732 | 3.9 | 55.8 | 32400 |
| Comp. Example 1 | NPB | — | 832 | 4.3 | 24.2 | 10700 |
| 2 | 1-1 | — | 1657 | 5.1 | 40.8 | 10700 |
| 3 | NPB | mCP | 1557 | 5.0 | 39.3 | 9400 |

From Table 3, as compared to Comparative Example 1 using no EB layer, in each of Examples 1, 2, 3, 4, 5, and 6 using a specific indolocarbazole derivative in the EB layer, an improvement in luminance and a reduction in driving voltage are observed and the luminous efficiency is found to be improved. In addition, the operation life characteristic is greatly improved. On the other hand, in Comparative Example 3 using mCP in the EB layer, an increase in driving voltage and a reduction in operation life occur, although an improvement in luminance is observed, which suggests the superiority of the indolocarbazole derivative. In Comparative Example 2 using the indolocarbazole derivative in the hole-transporting layer, an increase in driving voltage occurs and no improvement in life characteristic is observed, although the luminance is improved. The fact suggests that the use of the indolocarbazole derivative in the EB layer is effective. Based on those results, it is clear that the use of the above-mentioned indolocarbazole derivative in the EB layer allows attaining an organic EL phosphorescent light device having high efficiency and exhibiting a satisfactory life characteristic.

Example 7

On a glass substrate, on which an anode being formed of ITO and having a thickness of 150 nm had been formed, the respective thin films were laminated at a degree of vacuum of 4.0×10$^{-4}$ Pa by a vacuum deposit ion method. First, CuPc was formed into a film having a thickness of 25 nm as a hole-injecting layer on ITO. Next, NPB was formed into a film having a thickness of 45 nm a hole-transporting layer. Next, Compound 1-1 was formed into a film having a thickness of 10 nm as an EB layer on the hole-transporting layer. Next, DCZP and Ir(piq)$_2$acac were co-deposited from different deposition sources to form a film having a thickness of 40 nm as a light-emitting layer. In this case, the concentration of Ir(piq)$_2$acac was 4.5 wt %. Next, Alq3 was formed into a film having a thickness of 37.5 nm as an electron-transporting layer. In addition, lithium fluoride (LiF) was formed into a film having a thickness of 0.5 nm as an electron-injecting layer on the electron-transporting layer. Finally, aluminum (Al) was formed into a film having a thickness of 170 nm as an electrode on the electron-injecting layer. Thus, an organic EL device was produced.

The resultant organic EL device was connected to an exterior power source and applied with a DC voltage. As a result, the device was found to have a light emission characteristic as shown in Table 4. In Table 4, the luminance, voltage, and luminous efficiency are values obtained during the driving of the device at a current of 2.5 mA/cm$^2$, and LT50 is a value obtained by evaluating the device by constant current driving at 20 mA/cm$^2$ and converting the evaluation result to one at an initial luminance of 1,000 cd/m$^2$. The maximum wavelength of the light emission spectrum of the device is 620 nm, showing that light emission is provided by Ir(piq)$_2$acac.

Example 8

An organic EL device was produced in the same manner as in Example 7 except that Compound 1-40 was used in the EB layer in Example 7.

Example 9

An organic EL device was produced in the same manner as in Example 7 except that Compound 2-12 was used in the EB layer in Example 7.

Example 10

An organic EL device was produced in the same manner as in Example 7 except that Compound 6-2 was used in the EB layer in Example 7.

Comparative Example 4

An organic EL device was produced in the same manner as in Example 4 except that the film thickness of NPB serving as the hole-transporting layer was set to 55 nm and no EB layer was used in Example 4.

The maximum wavelength of the light emission spectrum of the organic EL device obtained in any of Examples 7 to 10 and Comparative Example 4 is 620 nm, showing that light emission is provided by Ir(pig)$_2$acac. Table 4 shows the resultant light emission characteristics.

From Table 4, as compared to Comparative Example 4 using no EB layer, in each of Examples 7, 8, 9, and 10 using a specific indolocarbazole derivative in the EB layer, the luminous efficiency and the operation life are found to be greatly improved.

INDUSTRIAL APPLICABILITY

The indolocarbazole compound to be used in the present invention exhibits a satisfactory hole-transporting characteristic and has a high LUMO energy. Therefore, the provision of the EB layer containing the indolocarbazole compound between the hole-transporting layer and the phosphorescent light-emitting layer so as to be adjacent to the phosphorescent light-emitting layer allows holes to be effectively transported from the anode to the light-emitting layer and simultaneously allows blocking electrons and excitons from leaking from the light-emitting layer to the hole-transporting layer. As a result, an improvement in luminous efficiency and an improvement in operation life of the device are achieved. That is, the EB layer in the present invention has a function of the electron-blocking layer and/or the exciton-blocking layer, and the EB layer greatly improves the initial characteristics and operation life of the organic EL device.

In addition, the inventors of the present invention have found that the indolocarbazole compound has satisfactory thin film stability and thermal stability, and have clarified that the organic EL device having the EB layer including the indolocarbazole compound is an organic EL device exhibiting excellent driving stability and having high durability.

The organic EL device of the present invention is at a practically satisfactory level in light emission characteristic, operation life, and durability. Accordingly, the organic EL device of the present invention has a large technical value in its applications to, for example, a flat panel display (such as a cellular phone display device, an on-vehicle display device, a display device for an OA computer, or a TV), a light source utilizing the feature of the device as a planar light emitter (a lighting device, a light source for a copying machine, or a backlight source for liquid crystal displays and meters), a display board, and a marker lamp.

The invention claimed is:
1. An organic electroluminescent device, comprising:
an anode;
a cathode; and
organic layers comprising at least:
a hole-injecting layer;
a hole-transporting layer;
a single light-emitting layer, and
an electron-transporting layer,

TABLE 4

| | Hole-transporting layer | EB layer compound | Initial characteristics (@2.5 mA/cm$^2$) | | | Life characteristic |
| | | | Luminance [cd/m$^2$] | Voltage [V] | Luminous efficiency [lm/W] | (@1000 cd/m$^2$) LT50 [hr] |
|---|---|---|---|---|---|---|
| Example 7 | NPB | 1-1 | 236 | 4.4 | 6.7 | 87200 |
| 8 | NPB | 1-40 | 218 | 4.6 | 6.0 | 75600 |
| 9 | NPB | 2-12 | 231 | 4.5 | 6.5 | 91300 |
| 10 | NPB | 6-2 | 225 | 4.5 | 6.3 | 82200 |
| Comp. Example 4 | NPB | — | 75 | 4.6 | 2.1 | 12300 | the organic layers being interposed between the anode and the cathode, wherein:

the single light-emitting layer comprises a phosphorescent light-emitting material and a host material;

the hole-transporting layer consists essentially of one or more compounds selected from the group consisting of a triazole derivative, an oxadiazole derivative, an imidazole derivative, a carbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a thiophene oligomer; and the hole-transporting layer and the single light-emitting layer have an electron- and/or exciton-blocking layer therebetween, the electron- and/or exciton-blocking layer being adjacent to the single light-emitting layer and containing an indolocarbazole compound represented by the following general formula (1):

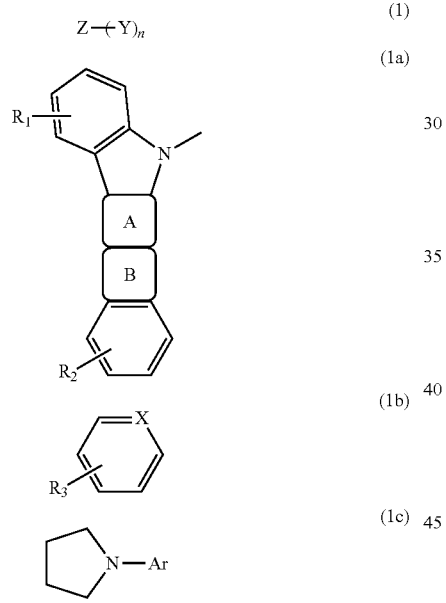

in the general formula (1): Z represents an n-valent aromatic hydrocarbon group having a total of 6 to 50 carbon atoms or an aromatic heterocyclic group having a total of 3 to 50 carbon atoms; Y represents a group represented by the formula (1a); n represents an integer of 2 to 6; and Y's may be identical to or different from each other;

in the formula (1a): a ring A represents an aromatic ring represented by the formula (1b) to be fused with adjacent rings; a ring B represents a heterocycle represented by the formula (1c) to be fused with adjacent rings; and $R_1$ and $R_2$ each independently represent a hydrogen atom, an aliphatic hydrocarbon group having a total of 1 to 10 carbon atoms, an aromatic hydrocarbon group having a total of 6 to 12 carbon atoms, or an aromatic heterocyclic group having a total of 3 to 11 carbon atoms;

in the formula (1 b): X represents a methine group or a nitrogen atom; $R_3$ represents a hydrogen atom, an aliphatic hydrocarbon group having a total of 1 to 10 carbon atoms, an aromatic hydrocarbon group having a total of 6 to 12 carbon atoms, or an aromatic heterocyclic group having a total of 3 to 11 carbon atoms, provided that $R_3$ may be fused with a ring including X to form a fused ring; and in the formula (1c), Ar represents an aromatic hydrocarbon group having a total of 6 to 50 carbon atoms or an aromatic heterocyclic group having a total of 3 to 50 carbon atoms;

wherein:

the indolocarbazole compound contained in the electron- and/or exciton-blocking layer has a LUMO energy higher than a LUMO energy of the host material contained in the single light-emitting layer and has a LUMO energy in eV of greater than or equal to −1.2, the hole-transporting material contained in the hole-transporting layer has a HOMO energy higher than a HOMO energy of the indolocarbazole compound contained in the electron- and/or exciton-blocking layer and has a HOMO energy in eV of greater than or equal to −4.8.

2. An organic electroluminescent device according to claim 1, wherein the host material is an electron-transporting host material.

3. An organic electroluminescent device according to claim 1, wherein the electron-transporting layer further comprises at least one material or materials having an electron transfer rate of $1\times10^{-7}$ cm$^2$N/V·s or more.

4. An organic electroluminescent device according to claim 1, wherein the indolocarbazole compound represented by the general formula (1) comprises an indolocarbazole compound represented by the following general formula (2):

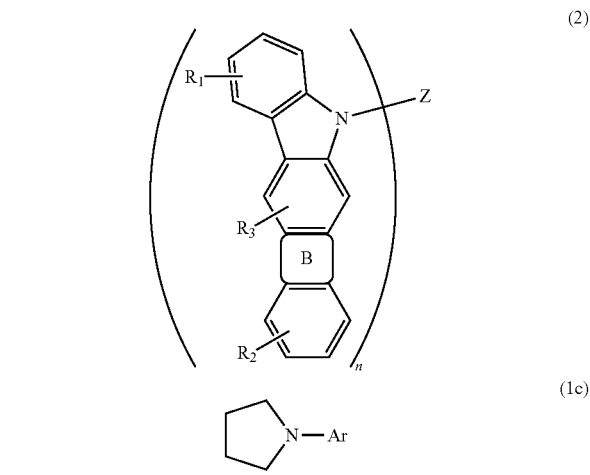

in the general formula (2): a ring B represents a heterocycle represented by the formula (1c) to be fused with adjacent rings; Z, Ar, $R_1$, and $R_2$ have the same meanings as those in the general formula (1); $R_3$ represents a hydrogen atom, an aliphatic hydrocarbon group having a total of 1 to 10 carbon atoms, an aromatic hydrocarbon group having a total of 6 to 12 carbon atoms, or an aromatic heterocyclic group having a total of 3 to 11 carbon atoms; and n represents 2.

5. An organic electroluminescent device according to claim 1, wherein the indolocarbazole compound represented by the general formula (1) is selected from indolocarbazole compounds represented by the following general formulae (3) to (6):

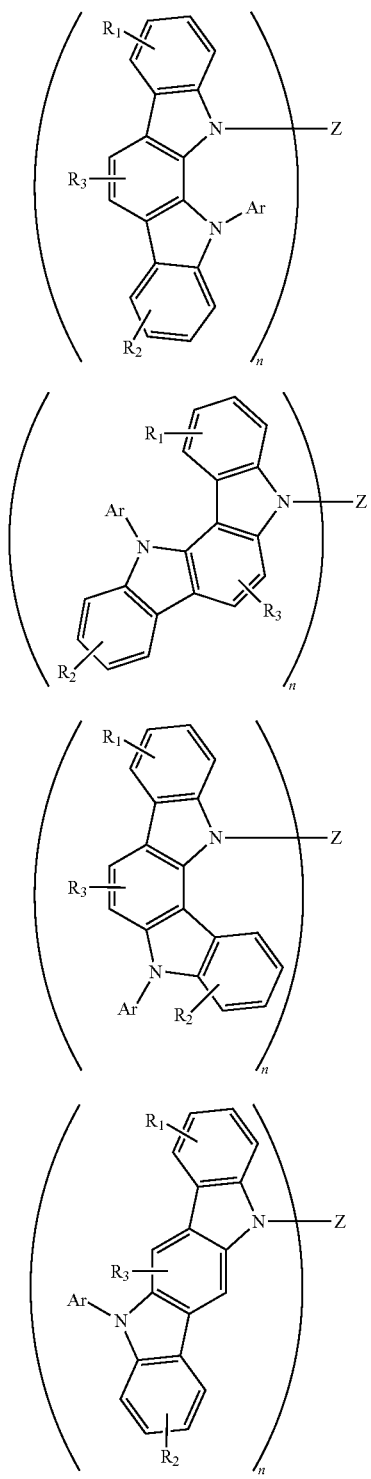

in the general formulae (3) to (6), Z, Ar, $R_1$, $R_2$, $R_3$, and n have the same meanings as those in the general formula (1).

6. An organic electroluminescent device according to claim 1,
wherein the hole-transporting layer consists essentially of one or more compounds selected from the group consisting of a porphyrin compound, an aromatic tertiary amine compound, and a styrylamine compound.

7. An organic electroluminescent device according to claim 2,
wherein the electron-transporting host material has an electron transfer rate of $1\times10$ cm$^2$/V·s or more.

8. An organic electroluminescent device according to claim 1,
wherein the single light-emitting layer is not adjacent to any other light-emitting layer.

9. An organic electroluminescent device according to claim 1,
wherein the LUMO energy and the HOMO energy are determined by a structure optimization calculation at the B3LYP/6-31G* level.

10. An organic electroluminescent device, comprising:
an anode;
a cathode; and
organic layers comprising at least:
a hole-injecting layer;
a hole-transporting layer;
a single light-emitting layer; and
an electron-transporting layer,
the organic layers being interposed between the anode and the cathode,
wherein:
the single light-emitting layer comprises a phosphorescent light-emitting material and a host material;
the hole-transporting layer consists essentially of one or more compounds selected from the group consisting of a triazole derivative, an oxadiazole derivative, an imidazole derivative, a carbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a thiophene oligomer; and
the hole-transporting layer and the single light-emitting layer have an electron- and/or exciton-blocking layer therebetween, the electron- and/or exciton-blocking layer being adjacent to the single light-emitting layer and containing an indolocarbazole compound represented by one of the following general formulae (3)-(5):

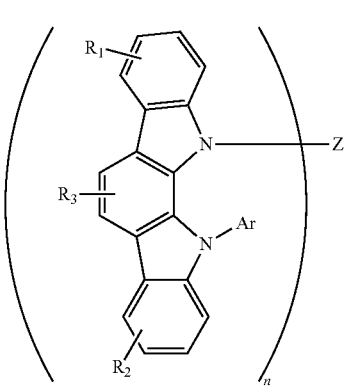

-continued

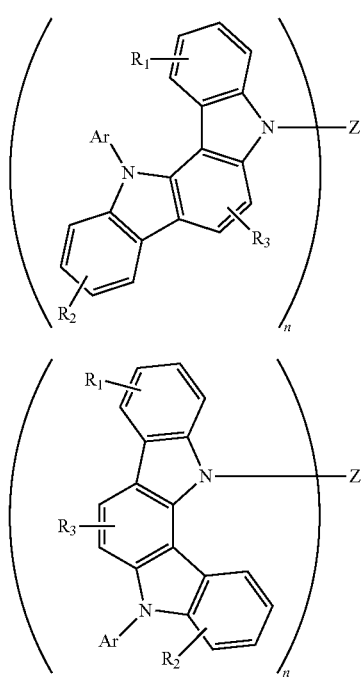

wherein in the formulae (3)-(5): Z represents an n-valent aromatic hydrocarbon group having a total of 6 to 50 carbon atoms or an aromatic heterocyclic group having a total of 3 to 50 carbon atoms;

$R_1$ and $R_2$ each independently represent a hydrogen atom, an aliphatic hydrocarbon group having a total of 1 to 10 carbon atoms, an aromatic hydrocarbon group having a total of 6 to 12 carbon atoms, or an aromatic heterocyclic group having a total of 3 to 11 carbon atoms;

$R_3$ represents a hydrogen atom, an aliphatic hydrocarbon group having a total of 1 to 10 carbon atoms, an aromatic hydrocarbon group having a total of 6 to 12 carbon atoms, or an aromatic heterocyclic group having a total of 3 to 11 carbon atoms, provided that $R_3$ may be fused with a ring including a methine group or a nitrogen atom to form a fused ring;

Ar represents an aromatic hydrocarbon group having a total of 6 to 50 carbon atoms or an aromatic heterocyclic group having a total of 3 to 50 carbon atoms; and n represents an integer of 2 to 6:

wherein:

the indolocarbazole compound contained in the electron- and/or exciton-blocking layer has a LUMO energy higher than a LUMO energy of the host material contained in the single light-emitting layer and has a LUMO energy in eV of greater than or equal to −1.2, the hole-transporting material contained in the hole-transporting layer has a HOMO energy higher than a HOMO energy of the indolocarbazole compound contained in the electron- and/or exciton-blocking layer and has a HOMO energy in eV of greater than or equal to −4.8.

11. An organic electroluminescent device according to claim 10, wherein the host material is an electron-transporting host material.

12. An organic electroluminescent device according to claim 10, wherein the electron-transporting layer further comprises at least one material or materials having an electron transfer rate of $1 \times 10$ cm$^2$/V·s or more.

13. An organic electroluminescent device according to claim 10,
wherein the hole-transporting layer consists essentially of one or more compounds selected from the group consisting of a porphyrin compound, an aromatic tertiary amine compound, and a styrylamine compound.

14. An organic electroluminescent device according to claim 11,
wherein the electron-transporting host material has an electron transfer rate of $1 \times 10$ cm$^2$/V·s or more.

15. An organic electroluminescent device according to claim 10,
wherein the single light-emitting layer is not adjacent to any other light-emitting layer.

16. An organic electroluminescent device according to claim 10,
wherein the LUMO energy and the HOMO energy are determined by a structure optimization calculation at the B3LYP/6-31G* level.

\* \* \* \* \*